(12) United States Patent
Inoue

(10) Patent No.: US 7,207,028 B2
(45) Date of Patent: Apr. 17, 2007

(54) SYSTEM FOR EVALUATING A DESIGN OF A MASK, EXPOSURE SYSTEM, METHOD FOR EVALUATING A DESIGN OF A MASK, METHOD FOR MANUFACTURING A SEMICONDUCTOR DEVICE AND MASK

(75) Inventor: Arata Inoue, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 4 days.

(21) Appl. No.: 11/185,679

(22) Filed: Jul. 21, 2005

(65) Prior Publication Data

US 2006/0023931 A1    Feb. 2, 2006

(30) Foreign Application Priority Data

Jul. 27, 2004    (JP)    ............................ P2004-219202

(51) Int. Cl.
*G06F 17/50*    (2006.01)
*G06F 9/45*    (2006.01)
(52) U.S. Cl. .................................. 716/19; 716/4; 716/5
(58) Field of Classification Search ................. 716/4–5, 716/19
See application file for complete search history.

(56) References Cited

U.S. PATENT DOCUMENTS

| | | | |
|---|---|---|---|
| 5,888,675 A | 3/1999 | Moore et al. | |
| 2004/0019870 A1* | 1/2004 | Ohmori | ........................ 716/19 |
| 2005/0025351 A1* | 2/2005 | Kotani et al. | ............... 382/144 |
| 2005/0110997 A1* | 5/2005 | Horie | ......................... 356/401 |
| 2006/0020362 A1 | 1/2006 | Morinaga et al. | |

* cited by examiner

*Primary Examiner*—Paul Dinh
*Assistant Examiner*—Suresh Memula
(74) *Attorney, Agent, or Firm*—Finnegan, Henderson, Farabow, Garrett & Dunner, L.L.P.

(57) ABSTRACT

A system for evaluating a design of a mask includes: an inspection data memory storing initial inspection data of an initial wafer fabricated by an initial mask; a design tool designing a modified mask based on the initial inspection data; a group of manufacturing tools forming an initial mask chip region with the initial mask and a modified mask chip region adjacent to the initial mask region with the modified mask; an inspection tool inspecting faults in the initial and modified mask chip regions; and an evaluation tool evaluating an improvement of the design of the modified mask.

18 Claims, 26 Drawing Sheets

| TEG MEASUREMENT | | | |
|---|---|---|---|
| Xt | Yt | Vth1(V) | Vth2(V) |
| 3 | 5 | 0.2 | 0.5 |
| 4 | 4 | 0.25 | 0.55 |
| 3 | 4 | 0.21 | 0.51 |
| 2 | 4 | 0.22 | 0.52 |
| 5 | 3 | 0.24 | 0.54 |
| 4 | 3 | 0.35 | 0.65 |
| 3 | 3 | 0.28 | 0.58 |
| 2 | 3 | 0.2 | 0.5 |
| 1 | 3 | 0.25 | 0.55 |
| 4 | 2 | 0.21 | 0.51 |
| 3 | 2 | 0.22 | 0.52 |
| 2 | 2 | 0.24 | 0.54 |
| 3 | 1 | 0.35 | 0.65 |

| CHARACTERISTIC | SPECIFICATION (nm) | MEASUREMENT VALUE (nm) |
|---|---|---|
| A | 20 | 40 |
| B | 40 | 40 |
| C | 70 | 60 |

FIG. 10

| D/S COORDINATES || FINAL TEST ||||
|---|---|---|---|---|---|
| Xd | Yd | SORT DATA | CHARACTERISTIC A | CHARACTERISTIC B | CHARACTERISTIC C |
| 3 | 1 | – | – | – | – |
| 2 | 2 | F | – | – | – |
| 3 | 2 | S2 | 40 | 40 | 60 |
| 4 | 2 | F | – | – | – |
| 1 | 3 | – | – | – | – |
| 2 | 3 | S1 | 20 | 40 | 60 |
| 3 | 3 | S1 | 10 | 20 | 30 |
| 4 | 3 | S2 | 20 | 50 | 30 |
| 5 | 3 | – | – | – | – |
| 2 | 4 | S3 | 40 | 50 | 60 |
| 3 | 4 | F | – | – | – |
| 4 | 4 | – | – | – | – |
| 3 | 5 | – | – | – | – |

FIG. 11

| YIELD (%) | SUM | S1 | S2 | S3 | F |
|---|---|---|---|---|---|
| 90 | 100 | 70 | 10 | 10 | 10 |

FIG. 12

| TEG MEASUREMENT | | | | D/S TEST | | | | FINAL TEST | | |
|---|---|---|---|---|---|---|---|---|---|---|
| Xt | Yt | Vth1(V) | Vth2(V) | Xd | Yd | D/S DATA | SORT DATA | CHARACTERISTIC A (nm) | CHARACTERISTIC B (nm) | CHARACTERISTIC C (nm) |
| 3 | 5 | 0.2 | 0.5 | 3 | 1 | F | – | – | – | – |
| 4 | 4 | 0.25 | 0.55 | 2 | 2 | P1 | F | – | – | – |
| 3 | 4 | 0.21 | 0.51 | 3 | 2 | P2 | S2 | 40 | 40 | 60 |
| 2 | 4 | 0.22 | 0.52 | 4 | 2 | P3 | F | – | – | – |
| 5 | 3 | 0.24 | 0.54 | 1 | 3 | F | – | – | – | – |
| 4 | 3 | 0.35 | 0.65 | 2 | 3 | P1 | S1 | 20 | 40 | 60 |
| 3 | 3 | 0.28 | 0.58 | 3 | 3 | P | S1 | 10 | 20 | 30 |
| 2 | 3 | 0.2 | 0.5 | 4 | 3 | P3 | S2 | 20 | 50 | 30 |
| 1 | 3 | 0.25 | 0.55 | 5 | 3 | F | – | – | – | – |
| 4 | 2 | 0.21 | 0.51 | 2 | 4 | P2 | S3 | 40 | 50 | 60 |
| 3 | 2 | 0.22 | 0.52 | 3 | 4 | P | F | – | – | – |
| 2 | 2 | 0.24 | 0.54 | 4 | 4 | F | – | – | – | – |
| 3 | 1 | 0.35 | 0.65 | 5 | 5 | F | – | – | – | – |

| PROCESS | PARAMETER | THRESHOLD |
|---------|-----------|-----------|
| D/S TEST | YIELD OF WAFER | EXCLUSION 5% OR LESS |
| D/S TEST | DC FAULT RATE OF WAFER | EXCLUSION 90% OR MORE |

FIG. 19

| PROCESS | DATA CLASS | FINAL RESULT | SUM |
|---|---|---|---|
| D/S TEST | CATEGORY | P | 100 |
| | | P1 | 120 |
| | | P2 | 140 |
| | | P3 | 160 |
| | | F | 1000 |
| FINAL TEST | SORT | S1 | 5 |
| | | S2 | 10 |
| | | S3 | 15 |
| | | F | 200 |
| FINAL TEST | CHARACTERISTIC A | 10 OR LESS | 1 |
| | | 10 OR MORE | 5 |
| | CHARACTERISTIC B | 20 OR LESS | 1 |
| | | 20 OR MORE, 40 LESS | 5 |
| | | 40 OR MORE | 10 |
| | CHARACTERISTIC C | 30 OR LESS | 1 |
| | | 30 OR MORE | 5 |

FIG. 20

| Xd | Yd | D/S | SORT | CHARACTERISTIC A | CHARACTERISTIC B | CHARACTERISTIC C | SUM |
|---|---|---|---|---|---|---|---|
| 3 | 1 | 1000 | 0 | 0 | | | 1000 |
| 4 | 2 | 120 | 200 | 0 | | | 320 |
| 3 | 2 | 140 | 10 | 5 | 5 | 5 | 170 |
| 2 | 2 | 160 | 200 | 0 | | | 360 |
| 1 | 3 | 1000 | 0 | 0 | | | 1000 |
| 2 | 3 | 120 | 5 | 5 | 5 | | 135 |
| 3 | 3 | 100 | 5 | 1 | 1 | 1 | 108 |
| 4 | 3 | 160 | 10 | 5 | 10 | 1 | 186 |
| 5 | 3 | 1000 | 0 | 0 | | | 1000 |
| 2 | 4 | 140 | 15 | 5 | 10 | 5 | 175 |
| 3 | 4 | 100 | 200 | 0 | | | 300 |
| 4 | 4 | 1000 | 0 | 0 | | | 1000 |
| 3 | 5 | 1000 | 0 | 0 | | | 1000 |

FIG. 21

|    | 1 | 2 | 3 | 4 | 5 |
|----|---|---|---|---|---|
| 1  |   |   | 1000 |   |   |
| 2  |   | 320 | 170 | 360 |   |
| Yd 3 | 1000 | 135 | 108 | 186 | 1000 |
| 4  |   | 175 | 300 | 1000 |   |
| 5  |   |   | 1000 |   |   |

At Yd=3: MODIFIED at Xd=2, INITIAL at Xd=3.

|    | 1 | 2 | 3 | 4 | 5 |
|----|---|---|---|---|---|
| 1  |   |   | INITIAL |   |   |
| 2  |   | FIRST | MODIFIED | FIRST |   |
| Yd 3 | FIRST | SECOND | FIRST | SECOND | FIRST |
| 4  |   | FIRST | SECOND | FIRST |   |
| 5  |   |   | FIRST |   |   |

| CHARACTERISTIC | SPECIFICATION | MEASUREMENT VALUE OF INITIAL MASK | MEASUREMENT VALUE OF MODIFIED MASK |
|---|---|---|---|
| A | 20 | 40 | 10 |
| B | 40 | 40 | 20 |
| C | 70 | 60 | 30 |

FIG. 28

| MASK | YIELD (%) | SUM | S1 | S2 | S3 | F |
|---|---|---|---|---|---|---|
| INITIAL MASK | 90 | 50 | 35 | 5 | 5 | 5 |
| MODIFIED MASK | 90 | 50 | 30 | 15 | 0 | 5 |

FIG. 33

|  | 1 | 2 | 3 | 4 | 5 |
|---|---|---|---|---|---|
| 1 |  |  | INITIAL |  |  |
| 2 |  | MODIFIED | INITIAL | MODIFIED |  |
| Yd 3 | INITIAL | MODIFIED | INITIAL | MODIFIED |  |
| 4 |  | MODIFIED | INITIAL | MODIFIED |  |
| 5 |  |  | INITIAL |  |  |

|  | 1 | 2 | 3 | 4 | 5 |
|---|---|---|---|---|---|
| 1 |  |  | INITIAL |  |  |
| 2 |  | MODIFIED | MODIFIED | MODIFIED |  |
| Yd 3 | INITIAL | INITIAL | INITIAL | INITIAL | INITIAL |
| 4 |  | MODIFIED | MODIFIED | MODIFIED |  |
| 5 |  |  | INITIAL |  |  |

|  | Xd 1 | 2 | 3 | 4 | 5 |
|---|---|---|---|---|---|
| 1 |  |  | INITIAL |  |  |
| 2 |  | MODIFIED | INITIAL | MODIFIED |  |
| Yd 3 | INITIAL | INITIAL | INITIAL | INITIAL | INITIAL |
| 4 |  | MODIFIED | INITIAL | MODIFIED |  |
| 5 |  |  | INITIAL |  |  |

FIG. 36

|  | Xd 1 | 2 | 3 | 4 | 5 |
|---|---|---|---|---|---|
| 1 |  |  | INITIAL |  |  |
| 2 |  | MODIFIED | INITIAL | INITIAL |  |
| Yd 3 | MODIFIED | MODIFIED | INITIAL | INITIAL | INITIAL |
| 4 |  | MODIFIED | INITIAL | INITIAL |  |
| 5 |  |  | INITIAL |  |  |

FIG. 37

|    | 1 | 2 | 3 | 4 | 5 |
|----|---|---|---|---|---|
| 1  |   |   |   |   |   |
| 2  |   | INITIAL | MODIFIED | INITIAL |   |
| 3  |   | MODIFIED | INITIAL | MODIFIED |   |
| 4  |   | INITIAL | MODIFIED |   |   |
| 5  |   |   |   |   |   |

(Yd vertical axis, Xd horizontal axis)

FIG. 38

|    | 1 | 2 | 3 | 4 | 5 |
|----|---|---|---|---|---|
| 1  |   |   |   |   |   |
| 2  |   | MODIFIED | INITIAL | MODIFIED |   |
| 3  |   | MODIFIED | INITIAL | MODIFIED |   |
| 4  |   | MODIFIED | INITIAL |   |   |
| 5  |   |   |   |   |   |

(Yd vertical axis, Xd horizontal axis)

FIG. 39

[Grid plot with Xd on x-axis (1-5) and Yd on y-axis (1-5):
- Row Yd=2: MODIFIED (Xd=2), MODIFIED (Xd=3), MODIFIED (Xd=4)
- Row Yd=3: INITIAL (Xd=2), INITIAL (Xd=3), INITIAL (Xd=4)
- Row Yd=4: MODIFIED (Xd=2), MODIFIED (Xd=3)]

FIG. 40

[Grid plot with Xd on x-axis (1-5) and Yd on y-axis (1-5):
- Row Yd=2: MODIFIED (Xd=2), INITIAL (Xd=3), MODIFIED (Xd=4)
- Row Yd=3: INITIAL (Xd=2), INITIAL (Xd=3), INITIAL (Xd=4)
- Row Yd=4: MODIFIED (Xd=2), INITIAL (Xd=3)]

FIG. 43

|    | 1 | 2 | 3 | 4 | 5 |
|----|---|---|---|---|---|
| 1  |   |   | A |   |   |
| 2  |   | C | C | A |   |
| 3  | A | B | A | B | B |
| 4  |   | A | B | C |   |
| 5  |   |   | C |   |   |

Yd (vertical), Xd (horizontal)

FIG. 44

|    | 1 | 2 | 3 | 4 | 5 |
|----|---|---|---|---|---|
| 1  |   |   | MODIFIED |   |   |
| 2  |   | INITIAL | INITIAL | MODIFIED |   |
| 3  | INITIAL | MODIFIED | INITIAL | INITIAL | INITIAL |
| 4  |   | MODIFIED | MODIFIED | INITIAL |   |
| 5  |   |   | MODIFIED |   |   |

Yd (vertical), Xd (horizontal)

SYSTEM FOR EVALUATING A DESIGN OF A MASK, EXPOSURE SYSTEM, METHOD FOR EVALUATING A DESIGN OF A MASK, METHOD FOR MANUFACTURING A SEMICONDUCTOR DEVICE AND MASK

CROSS REFERENCE TO RELATED APPLICATIONS AND INCORPORATED BY REFERENCE

The application is based upon and claims the benefit of priority from the prior Japanese Patent Applications No. P2004-219202, filed on Jul. 27, 2004; the entire contents of which are incorporated herein by reference.

BACKGROUND OF THE INVENTION

1. Field of the Invention

The present invention relates to manufacturing technology for a semiconductor device, more particularly, to a system for evaluating a design of a mask, an exposure system, a method for evaluating a design of a mask, a method for manufacturing a semiconductor device, and a mask.

2. Description of the Related Art

In a manufacturing process for a semiconductor device, a layout design to implement functions and specifications of the semiconductor device is developed in a design process, and a photomask (hereinafter, referred to as a "mask") is fabricated. In wafer processing, semiconductor wafers are manufactured using the mask. Subsequently, in an inspection process, the functions and performance of circuits of the semiconductor wafers are inspected. When the inspection reveals a fault such that a desired function or performance cannot be achieved or the like, a design pattern causing the fault is modified in the design process, and the mask is modified.

In the wafer processing after the modification of the mask, and in a lithography process for the mask before modification (hereinafter, referred to as an initial mask) and the mask after modification (hereinafter, referred to as a modified mask), a semiconductor wafer using the initial mask and another semiconductor wafer using the modified mask are separately exposed. These semiconductor wafers are processed under the same conditions in the other manufacturing processes. In the inspection process, the semiconductor wafer manufactured using the initial mask and the semiconductor wafer manufactured using the modified mask are inspected and compared. An evaluation is performed to determine whether the modified mask has fixed the fault of the semiconductor wafer fabricated using the initial mask as expected, and whether the modified mask has caused another fault or degraded the wafer, or the like. When the modified mask improves the wafer, wafer production using the initial mask is changed to wafer production using the modified mask. On the other hand, when the modification does not provide the expected results, the modified mask is further modified. This means that the yield of semiconductor devices in the manufacturing process is increased by repeating the mask modification and inspection.

However, in the wafer processing, semiconductor wafers have manufacturing variations. When the semiconductor wafer fabricated using the initial mask and the semiconductor wafer fabricated using the modified mask are inspected and compared, device characteristics sometimes depend more on the manufacturing variations caused in the wafer processing, than the improvement of the design due to the mask modification. In such a case, it has been difficult to evaluate the improvement of the design due to the mask modification.

SUMMARY OF THE INVENTION

An aspect of the present invention inheres in a system for evaluating a design of a mask includes: an inspection data memory configured to store initial inspection data of an initial wafer in which a pattern is formed by an initial mask; a design tool configured to design a modified mask by modifying the initial mask based on the initial inspection data; a group of manufacturing tools configured to forming in a modified wafer an initial mask chip region with the initial mask and a modified mask chip region adjacent to the initial mask region with the modified mask; an inspection tool configured to inspect faults in the initial and modified mask chip regions after a series of processes executed by the manufacturing tools; and an evaluation tool configured to evaluate an improvement of the design of the modified mask with respect to the initial mask, by comparing inspected faults in the initial and modified mask chip regions.

Another aspect of the present invention inheres in a system for evaluating a design of a mask includes: an inspection data memory configured to store initial inspection data of an initial wafer in which a pattern is formed by initial lithography data; a design tool configured to design modified lithography data by modifying the initial lithography data based on the initial inspection data; a group of manufacturing tools configured to form in a modified wafer an initial lithography chip region with the initial lithography data and a modified lithography chip region adjacent to the initial lithography chip region with the modified lithography data; an inspection tool configured to inspect faults in the initial and modified lithography chip regions after a series of procedures executed by the manufacturing tools; and an evaluation tool configured to evaluate an improvement of the design of the modified lithography data with respect to the initial lithography data by comparing inspected faults in the initial and modified lithography chip regions.

An additional aspect of the present invention inheres in exposure system includes: a distribution data generation unit configured to generate in-plane distribution data showing in-plane distribution characteristics in an initial wafer in which a pattern is formed by an initial mask, based on initial inspection data of the initial wafer; and a shot map generation unit configured to generate a shot map of a modified wafer, by assigning the initial mask to an initial mask chip region and assigning a modified mask being modified the initial mask to a modified mask chip region adjacent to the initial mask chip region, respectively, based on the in-plane distribution data.

A further additional aspect of the present invention inheres in a method for evaluating a design of a mask includes: designing a modified mask by modifying the initial mask based on initial inspection data of an initial wafer in which a pattern is formed by an initial mask; forming in a modified wafer an initial mask chip region with the initial mask and a modified mask chip region adjacent to the initial mask chip region with the modified mask; inspecting faults in the initial and modified mask chip regions after a series of the procedures; and evaluating an improvement of the design of the modified mask with respect to the initial mask by comparing inspected faults in the initial and modified mask chip regions.

Another aspect of the present invention inheres in a method for manufacturing a semiconductor device includes:

designing a modified mask by modifying the initial mask based on initial inspection data of an initial wafer in which a pattern is formed by an initial mask; forming in a modified wafer an initial mask chip region with the initial mask and a modified mask chip region adjacent to the initial mask chip region with the modified mask; inspecting faults in the initial and modified mask chip regions after a series of the procedures; evaluating an improvement of the design of the modified mask with respect to the initial mask by comparing inspected faults in the initial and modified mask chip regions; further modifying the design of the modified mask when the design is improved; and forming a pattern in a production wafer with the modified mask when the design is improved.

An additional aspect of the present invention inheres in a mask produced by: designing a modified mask by modifying the initial mask based on initial inspection data of an initial wafer in which a pattern is formed by an initial mask; forming in a modified wafer an initial mask chip region with the initial mask and a modified mask chip region adjacent to the initial mask chip region with the modified mask; inspecting faults in the initial and modified mask chip regions after a series of the procedures; evaluating an improvement of the design of the modified mask with respect to the initial mask by comparing inspected faults in the initial and modified mask chip regions; further modifying the design of the modified mask based on results of the evaluation.

BRIEF DESCRIPTION OF DRAWINGS

FIG. 10 is a graph showing another example of characteristic data according to the embodiment of the present invention.

FIG. 11 is a graph showing an example of sort data according to the embodiment of the present invention.

FIG. 12 is a graph showing an example of a table according to the embodiment of the present invention.

FIG. 19 is a graph showing an example of tone level definition according to the embodiment of the present invention.

FIG. 20 is a graph showing an example for explaining adding level points according to the embodiment of the present invention.

FIG. 21 is a schematic view showing an example of in-plane distribution data according to the embodiment of the present invention.

FIGS. 22 and 23 are schematic views showing an example of a shot map according to the embodiment of the present invention.

FIG. 27 is a graph showing another example of characteristic data according to the embodiment of the present invention.

FIG. 28 is a graph showing another example of sort data according to the embodiment of the present invention.

FIGS. 33 to 36 are schematic views showing examples of shot maps according to a third modification of the embodiment of the present invention.

FIGS. 37 to 42 are schematic views showing example of shot maps according to a fourth modification of the embodiment of the present invention.

FIG. 43 is a schematic view showing an example of a shot map according to a fifth modification of the embodiment of the present invention.

FIG. 44 is a schematic view showing an example of a shot map according to another embodiment of the present invention.

DETAILED DESCRIPTION OF THE INVENTION

Figure 1:
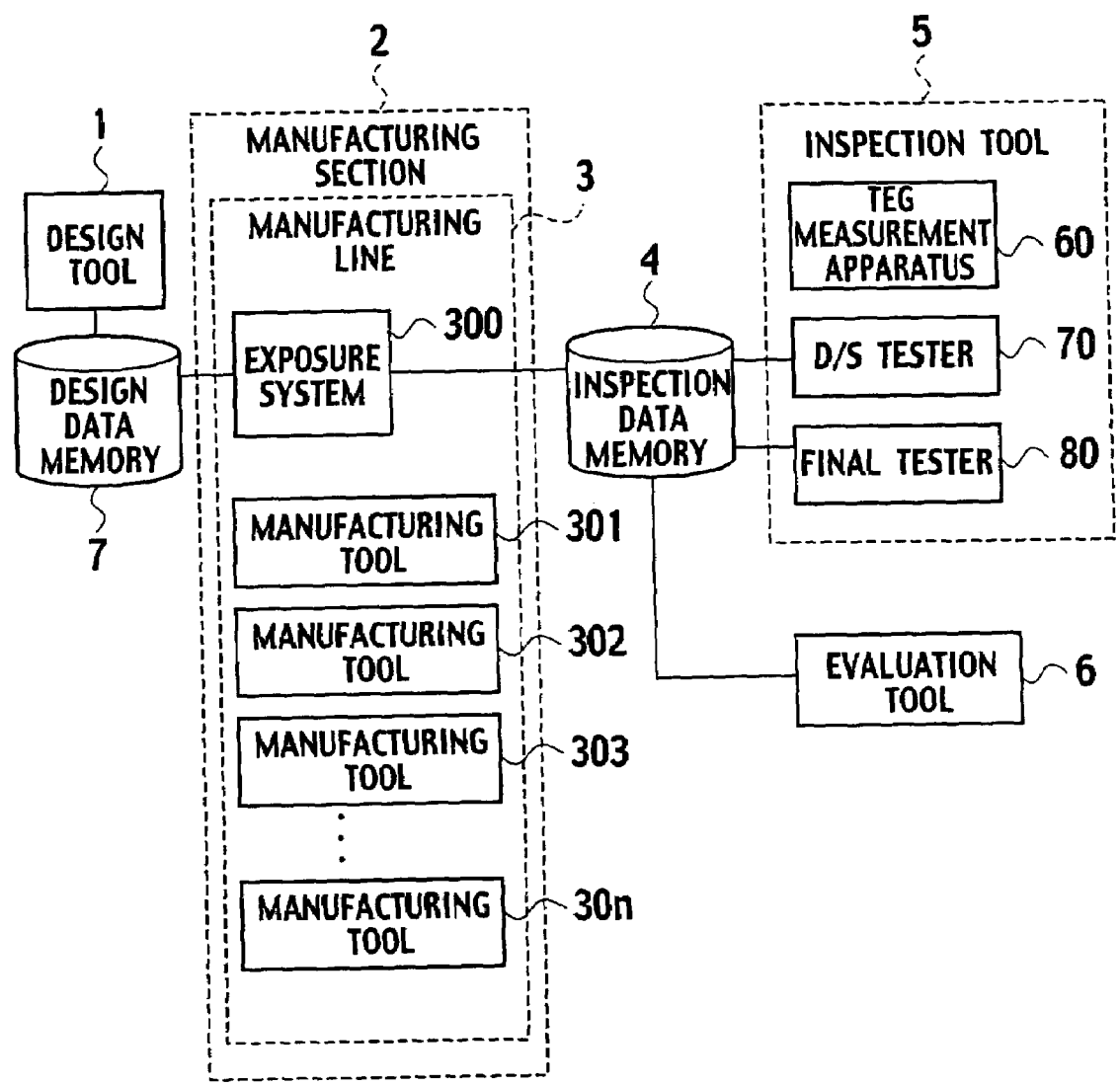
FIG. 1 is a block diagram showing an example of a system for manufacturing a semiconductor device according to an embodiment of the present invention.

An embodiment and various modifications of the present invention will be described with reference to the accompanying drawings. It is to be noted that the same or similar reference numerals are applied to the same or similar parts and elements throughout the drawings, and the description of the same or similar parts and elements will be omitted or simplified.

As shown in FIG. 1, a system for evaluating a design of a mask and for manufacturing a mask and a semiconductor device according to an embodiment of the present invention includes a design tool 1, a manufacturing section 2, an inspection tool 5, and an evaluation tool 6. The design tool 1 determines functions and specifications of circuits of a semiconductor device and performs layout design to fabricate a plurality of masks (reticles). The design tool 1 includes a computer assisted design (CAD) system to carry out the layout design, a pattern generator (PG) to draw a mask pattern on a mask substrate, and the like.

Figure 2:
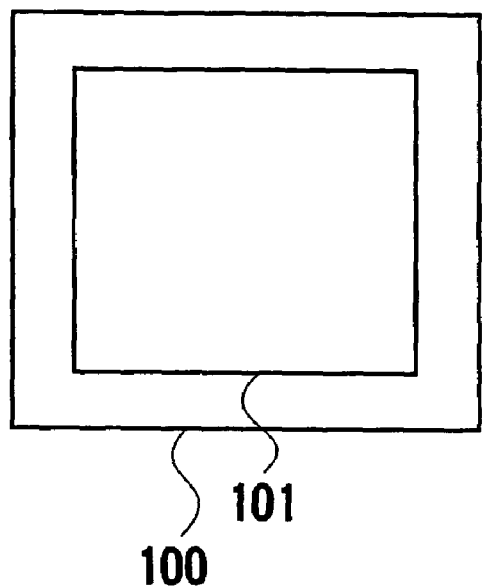
FIG. 2 is a schematic view showing an example of initial design data according to the embodiment of the present invention.
Figure 3:
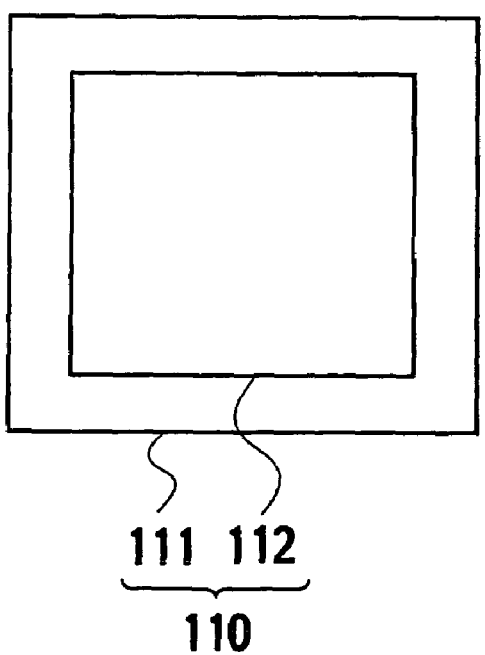
FIG. 3 is a schematic view showing an example of an initial mask according to the embodiment of the present invention.

In the design tool 1, initial design data 100 including an initial design pattern 101, as shown in FIG. 2, is generated. Based on the initial design data 100, an initial mask 110, as shown in FIG. 3, is fabricated. The initial mask 110 includes a mask substrate 111 and an initial mask pattern 112 disposed on the mask substrate 111.

The manufacturing section 2, shown in FIG. 1, includes a semiconductor device manufacturing line 3 on which a group of manufacturing tools is arranged. The manufacturing line 3 includes an exposure system (manufacturing tool) 300 and various types of manufacturing tools 301, 302, 303 . . . , and 30n, (n: integer). The manufacturing tools 301, 302, 303 . . . , and 30n can be, for example, a development apparatus, a chemical vapor deposition (CVD) apparatus, an oxidation apparatus, a heat treatment apparatus, an ion implantation apparatus, an etching apparatus, a sputtering apparatus, a dicing apparatus, and the like.

Figures 4, 5:
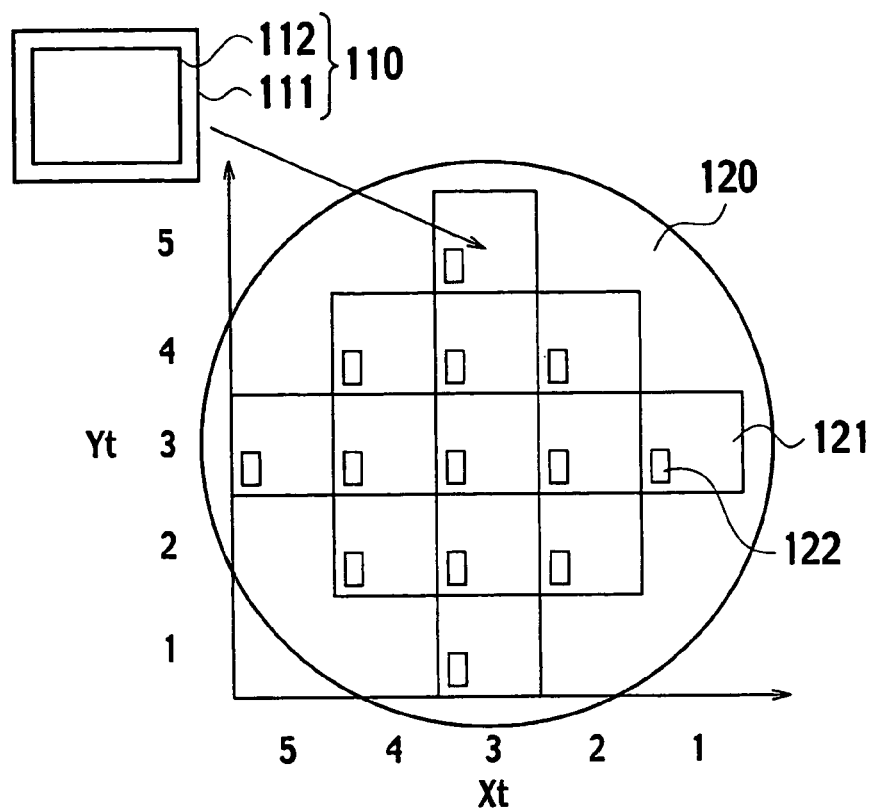
FIG. 4 is a schematic view showing an example of an initial wafer according to the embodiment of the present invention.
FIG. 5 is a graph showing an example of TEG measurement results according to the embodiment of the present invention.

In the manufacturing section 2, the initial mask pattern 112 of the initial mask 110, shown in FIG. 3, is transferred to a plurality of chip regions 121 of an initial wafer 120, shown in FIG. 4, by the exposure system 300. Through a series of processes using the manufacturing tools 301, 302, 303 . . . , and 30n, shown in FIG. 1, which includes a lithography process using the exposure system 300, circuits are delineated within the plurality of chip regions 121 of the initial wafer 120. In each chip region 121, a test element group (TEG) 122 for inspection is formed. FIG. 4 schematically shows the wafer 120, and more chip regions can be delineated in an actual initial wafer 120. The TEGs 122 may be arranged in part of the chip regions 121, instead of in every chip region 121.

The inspection tool 5, shown in FIG. 1, inspects characteristics concerning performance and functions of the semiconductor device, lead forms and sizes, reliability, and the like. The inspection tool 5 includes a TEG measurement apparatus 60, a die sort (D/S) tester 70, and a final tester 80. The TEG measurement apparatus 60 measures electrical characteristic values of semiconductor wafers manufactured by the manufacturing section 2, such as leak current and threshold voltage of the TEGs. For example, the TEG measurement apparatus 60 contacts the TEG 122 at TEG coordinates (Xt, Yt) with a needle probe for the initial wafer 120, shown in FIG. 4, and measures threshold voltages Vth1 and Vth2 of a transistor included in the TEG 122. Different measurement conditions are applied. Thus, TEG measurement results, shown in FIG. 5, are obtained. For example, the threshold value Vth1 of a transistor of the TEG at TEG coordinates (3, 5) is 0.2 V, and the threshold value Vth2 thereof is 0.5 V.

The D/S tester 70, shown in FIG. 1, carries out a D/S test for the plurality of chip regions 121 of the initial wafer 120, which is manufactured by the manufacturing section 2 and shown in FIG. 4, to sort acceptable chip regions from faulty chip regions. In the D/S test, for example, faulty chip regions having DC power-on faults, AC function faults, and the like are sorted out. The sorted faulty chip regions are fatally faulty chip regions which cannot be expected to perform a basic device operation. The D/S test is simple because of restrictions of wafer-level test conditions, test jigs and so on.

Figure 6:
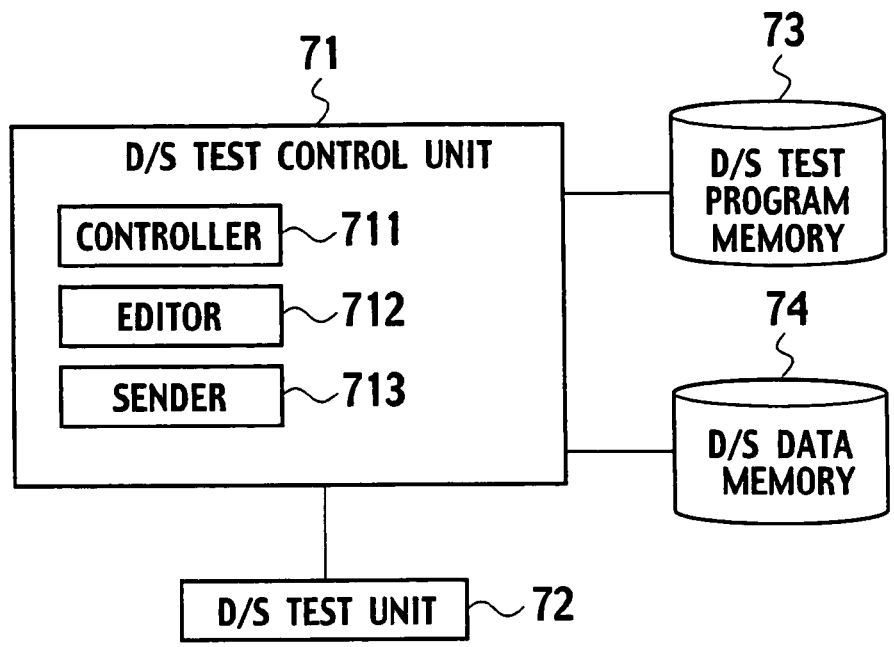
FIG. 6 is a block diagram showing an example of a D/S tester according to the embodiment of the present invention.

As shown in FIG. 6, the D/S tester 70 includes a D/S test program memory 73, a D/S test unit 72, a D/S test control unit 71 and a D/S data memory 74. The D/S test program memory 73 stores a D/S test program for carrying out a D/S test. The D/S test unit 72 carries out the D/S test.

The D/S test control unit 71 includes a controller 711, an editor 712 and the sender 713. The controller 711 controls the D/S test unit 72 by carrying out the D/S test program from the D/S test program memory 73. The editor 712 generates D/S data by editing D/S test results from the D/S test unit 72. The sender 713 sends the D/S data edited by the editor 712 to the inspection data memory 4, shown in FIG. 1.

The D/S data memory 74 stores the D/S test results from the D/S test unit 72, and the D/S data generated by the editor 712.

Figure 7:
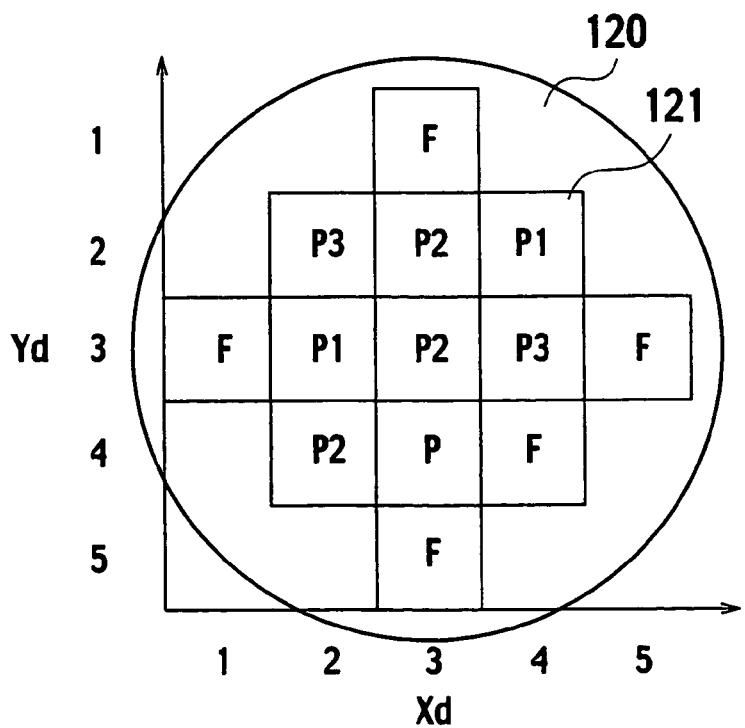
FIG. 7 is a schematic view showing an example of D/S data according to the embodiment of the present invention.

For example, the D/S data, shown in FIG. 7, is obtained by the D/S tester 70. Herein, D/S coordinates (Xd, Yd) as a test unit of the D/S test are different from the TEG coordinates (Xt, Yt), which are shown in FIG. 4, corresponding to the TEGs dotted with the initial wafer 120. The indicia "F" of the chip regions 121 at the D/S coordinates (1, 3), (3, 1), (3, 5), (4, 4), and (5, 3), shown in FIG. 7, indicate that these chip regions are faulty. The indicia "P" of the chip region 121 at the D/S coordinates (4, 3), "P1" of the chip regions 121 of the D/S coordinates (2, 4) and (3, 2), "P2" of the chip regions 121 at the D/S coordinates (2, 3), (3, 3), and (3, 2), "P3" of the chip regions 121 at the D/S coordinates (2, 2) and (3, 4) indicate that these chip regions are acceptable. Herein, these acceptable chip regions are further rated, and "P1", "P1", "P2", and "P3" indicate a best acceptable chip regions, a second best acceptable chip regions, a third best acceptable chip regions, and a fourth best acceptable chip regions, respectively. To use the D/S coordinates (Xd, Yd) also in a final test by the final tester 80, shown in FIG. 1, the controller 711 causes the D/S test unit 72 to write the D/S coordinates (Xd, Yd) into a storage area (ROM) included in each corresponding chip region 121 shown in FIG. 7.

The final tester 80, shown in FIG. 1, carries out a final test for the plurality of semiconductor devices (the plurality of chip regions) 121 which are obtained by the manufacturing section 2 separating the initial wafer 120 by dicing and assembling the same. The final test inspects whether the semiconductor devices 121 satisfy desired function and performance and whether the semiconductor devices 121 can achieve an expected yield to make a Go/No-Go decision. In the final test, characteristic values including row access time (tRAC) read cycle time (tRC), write cycle time (tWC), clock cycle time (tCK), and static supply current (IDD) are inspected.

Figures 8, 9:
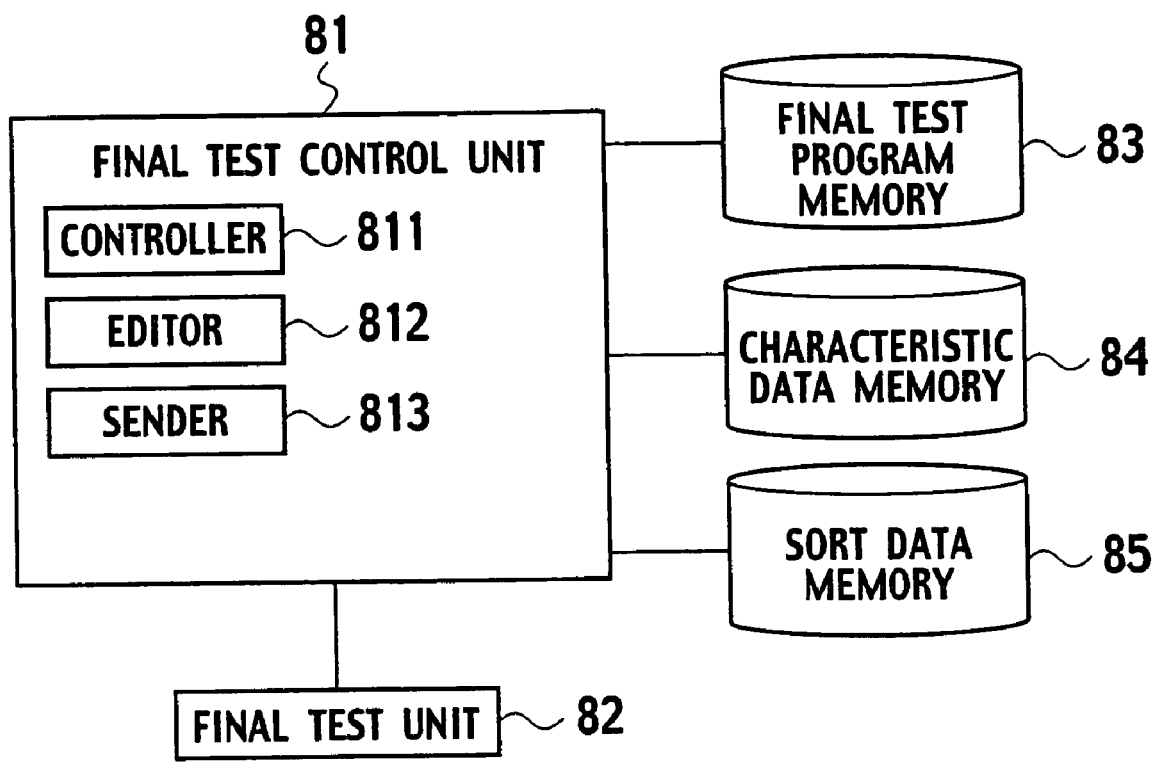
FIG. 8 is a block diagram showing an example of a final tester according to the embodiment of the present invention.
FIG. 9 is a graph showing an example of characteristic data according to the embodiment of the present invention.

As shown in FIG. 8, the final tester 80 includes a final test control unit 81, a final test unit 82, a final test program memory 83, a characteristic data memory 84 and the sort data memory 85. The final test program memory 83 stores a final test program for carrying out a final test. The final test unit 82 read D/S coordinates from a ROM of a semiconductor chip, and carries out the final test for each D/S coordinates.

The final test control unit 81 includes a controller 811, an editor 812 and a sender 813. The controller 811 controls the final test unit 82 by carrying out the final test program stored in the final test program memory 83. The editor 812 generates characteristic data and sort data by editing final test results from the final test unit 82. The sender 813 sends the characteristic data and the sort data edited by the editor 812 to the inspection data memory 4 shown in FIG. 1.

For example, characteristic data shown in FIG. 9 is obtained by the final tester 80. The "specification" shows limits (upper limits) of values of characteristics A to C allowing proper operation of the circuit in each chip region 121 of the initial wafer 120. Representative values for the characteristics A to C are 20, 40, and 70 ns, respectively. The characteristics A to C are, for example, tRAC, tRC, tWC, tCK, IDD, and the like.

The "Measurement value" shows results of measurements of the characteristics A to C. In this case, when the circuit in the chip region 121 performs a function operation, the measured values of the characteristics B and C are 40 ns and 60 ns, respectively, which satisfy the specifications. The measured value of the characteristic A is 40 ns, which is faulty (out of specification). FIG. 9 shows measured values for one of the chip regions 121. However, the measured values can be actually obtained for every chip region 121.

The editor 812, shown in FIG. 8, reads the characteristic data, for example, shown in FIG. 9, and edits the same so that the chip regions 121 are classified as acceptable chip regions whose measured value of any one of the characteristics A to C satisfies a desired specification. Furthermore, the editor 812 ranks the acceptable chip regions into three acceptable grades.

For example, as shown in FIG. 10, for each chip region 121, when the measured values of all the characteristics A to C satisfy the desired specifications, the chip region 121 is classified as a best acceptable chip region S1. When the measured values of any two of the characteristics A to C satisfy the desired specifications, the chip region 121 is classified as a second best acceptable chip region S2. When the measured value of one of the characteristics A to C satisfies the desired specification, the chip region 121 is classified as a third best acceptable chip region S3. When the measured values of all the characteristics A to C do not satisfy the desired specifications, the chip region 121 is classified as a faulty chip region F.

Further, the editor 812 generates sort data, as shown in FIG. 11, based on the result of the editing, shown in FIG. 10. The sort data includes, for example, a yield of the chip regions 121 of the initial wafer 120, the total number of the chip regions 121, the number of the best acceptable chip regions S1, the number of the second best acceptable chip regions S2, the number of the third best acceptable chip regions S3, and the number of the faulty chip regions F. In FIG. 11, out of a total of 100 pieces, there are 70 best acceptable chip regions S1, ten second best acceptable chip regions S2, ten third best acceptable chip regions S3, and ten faulty chip regions F. The yield thereof is 90%.

The evaluation tool 6, shown in FIG. 1, at the D/S test by the D/S tester 70, evaluates the need for mask modification due to the presence of a fatal fault, based on the D/S data edited by the edit section 712. Moreover, the evaluation tool 6, at the final test by the final tester 80, reads the TEG measurement results, shown in FIG. 5, obtained by the TEG measurement apparatus 60 and the characteristic data shown in FIGS. 9 and 10 and sort data shown in FIG. 11, which are edited by the editor 812. The evaluation tool 6 then correlates these data with each other using the TEG and D/S coordinates as keys to generate a table shown in FIG. 12.

Furthermore, the evaluation tool 6 generates similar tables for a plurality of initial wafers manufactured in the same way as the initial wafer 120. The evaluation tool 6 then evaluates the need for mask modification, based on the table shown in FIG. 12.

Figure 13:
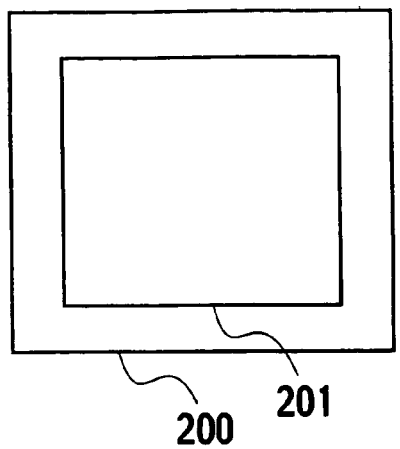
FIG. 13 is a schematic view showing an example of modified design data according to the embodiment of the present invention.
Figure 14:
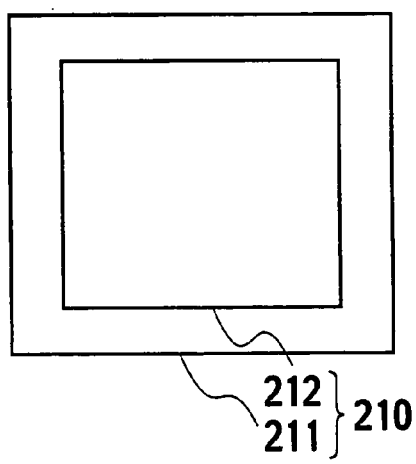
FIG. 14 is a schematic view showing an example of a modified mask according to the embodiment of the present invention.

When the evaluation tool 6 determines that mask modification is necessary, in the design tool 1, a fault of the initial design pattern 101 of the initial design data 100, shown in FIG. 2, is modified to generate modified design data 200 including a modified design pattern 201, as shown in FIG. 13. Based on the modified design data 200, as shown in FIG. 14, a modified mask 210 including a mask substrate 211 and a modified mask pattern 212 disposed on the mask substrate 211 is fabricated.

For evaluating the improvement of the design of the modified mask with respect to the initial mask due to the mask modification, there is a method of forming patterns in a modified wafer using the modified mask 210, instead of the initial mask 110, inspecting the modified wafer, and comparing the inspection results thereof with the inspection results of the initial wafer 120. However, it is difficult to evaluate the improvement of the design due to the mask modification by comparing the inspection results of the initial wafer 120 and the modified wafer, because of the manufacturing variations of wafers.

Figure 15:
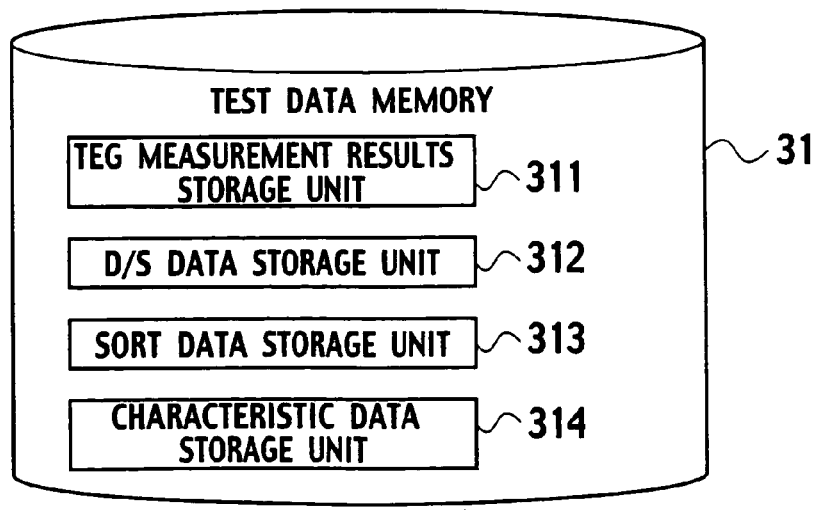
FIG. 15 is a block diagram showing an example of a inspection data memory according to the embodiment of the present invention.

As shown in FIG. 15, the inspection data memory 4 includes a TEG measurement results storage unit 311, the D/S data storage unit 312, the sort data storage unit 313 and the characteristic data storage unit 314. The TEG measurement results storage unit 311 stores TEG measurement results from the TEG measurement apparatus 60, shown in FIG. 1. The D/S data storage unit 312 stores the D/S data from the D/S tester 70. The sort data storage unit 313 stores the sort data from the final tester 80. The characteristic data storage unit 314 stores the characteristic data from the final tester 80.

The design data memory 7 stores design data including mask information according to the initial mask 110 and the modified mask 210 designed by the design tool 1.

Figure 16:
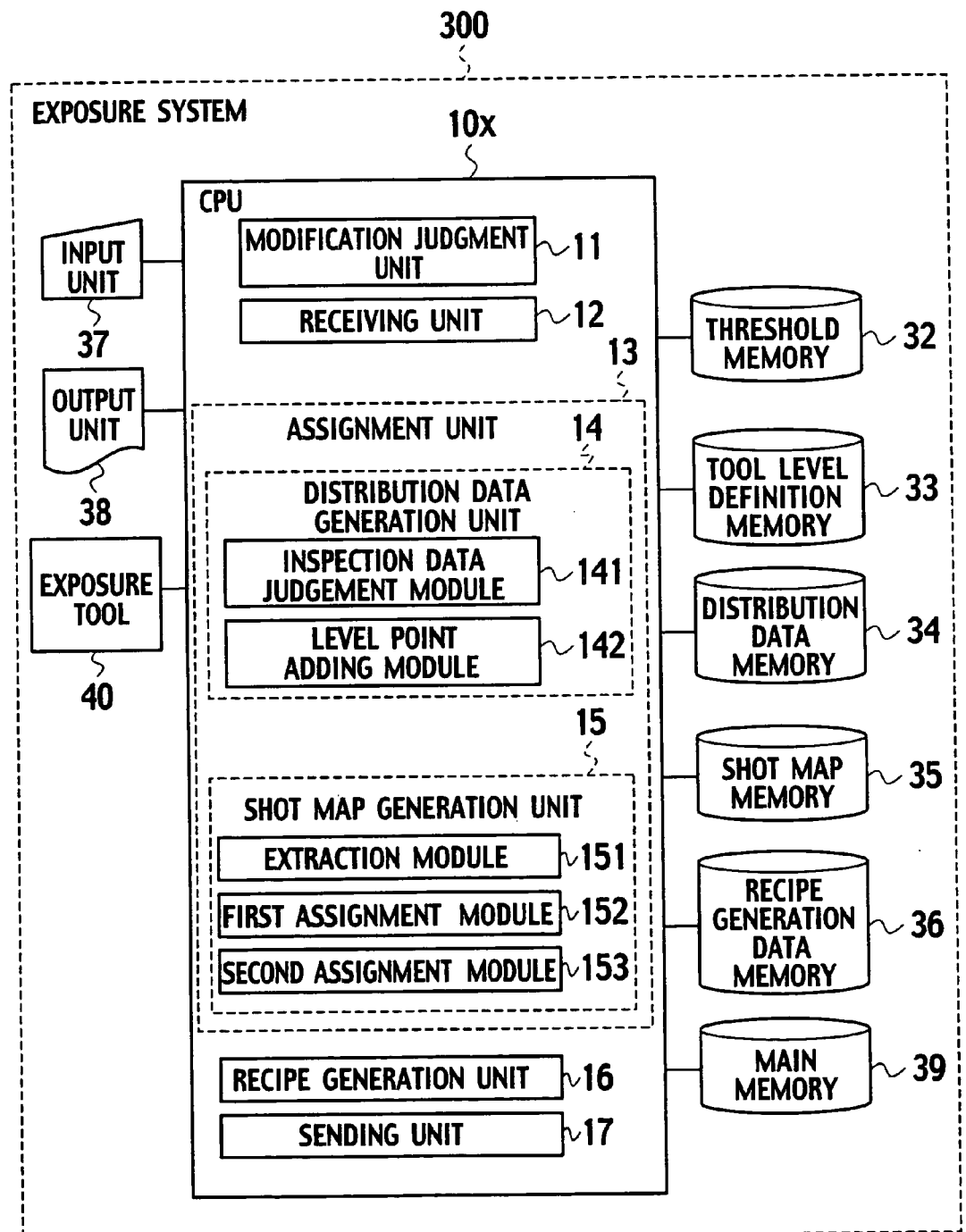
FIG. 16 is a block diagram showing an example of an exposure system according to the embodiment of the present invention.

As shown in FIG. 16, the exposure system 300, arranged on the manufacturing line 3, includes a central processing unit (CPU) 10, a threshold information memory 32, a tone level definition memory 33, an distribution data memory 34, a shot map memory 35, a recipe generation data memory 36, an input unit 37, an output unit 38, a main storage memory 39, and an exposure tool 40.

Figures 17, 18:
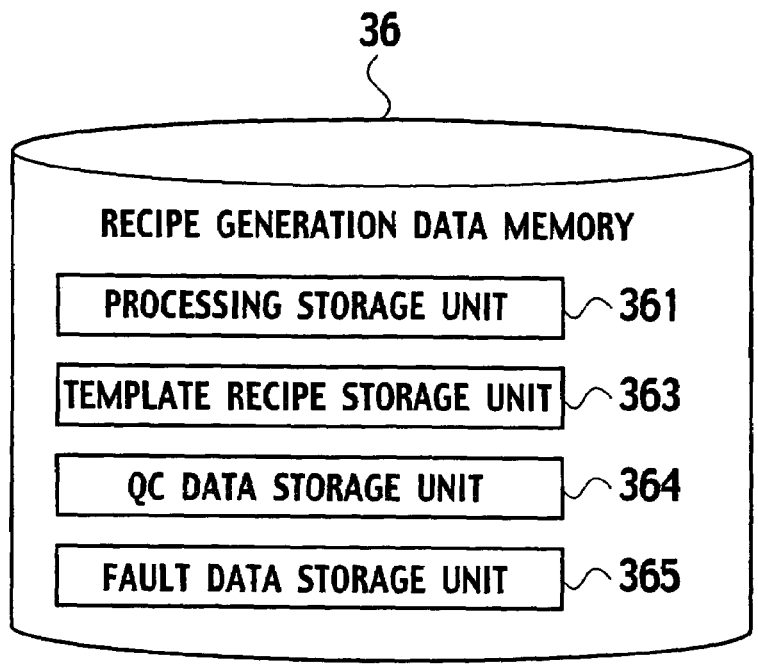
FIG. 17 is a block diagram showing an example of recipe generation data memory according to the embodiment of the present invention.
FIG. 18 is a graph showing an example of threshold value information according to the embodiment of the present invention.

The threshold information memory 32 stores threshold information for the results of the D/S test or final test performed for the initial wafer 120. As shown in FIG. 18, the threshold information includes, for example, process information such as the D/S test and final test, parameter information such as the yield of the initial wafer 120 and percentage of DC faults of the wafer 120, and criteria for exclusion such as not more than 5% and not less than 95%.

As shown in FIG. 17, the recipe generation data memory 36 includes: a processing data storage unit 361 storing processing data for putting a lot into the exposure tool 40; a template recipe storage section 363 storing a generation template recipe: a QC data storage unit 364 storing quality control (QC) data acquired in the wafer processing in the manufacturing section 2; and a fault data storage unit 365 storing fault data acquired in the wafer processing.

The tone level definition memory 33, shown in FIG. 16, stores tone level definitions which are defined as "level points". The level points are obtained by digitizing functions and performance of a circuit in each chip region 121 of the initial wafer 120. A lower level point of a parameter indicates that the function and performance of the parameter is more excellent. The level points can be defined to any value by a user through the input unit 37 shown in FIG. 16.

As shown in FIG. 19, the tone level definitions include, for example, process information, data information, initial inspection data, and the level points. The level points corresponding to the acceptable chip regions P, P1, P2, and P3 having best, second best, third best, and fourth best values of the category of the D/S test and the faulty chip region F are 100, 120, 140, 160, and 1000, respectively. The level points corresponding to the acceptable chip regions S1, S2, S3, and F having best, second best, third best, and fourth best values of the sort data of the final test are 5, 10, 15, and 200, respectively. When the value of the characteristic A of the characteristic data of the final test is less than 10 ns, the corresponding level point is 1; and for not less than 10 ns, the corresponding level point is 5. When the value of the characteristic 2 is less than 20 ns, the corresponding level point is 1; for not less than 20 and less than 40 ns, the corresponding level point is 5; and for not less than 40 ns, the corresponding level point is 10. When the value of the characteristic 3 is less than 30, the corresponding level point is 1; and for not less than 30, the corresponding level point is 5.

The CPU 10, shown in FIG. 16, includes a modification judgment unit 11, a receiving unit 12, an assignment unit 13, a recipe generation unit 16, and a sending unit 17. The modification judgment unit 11 judges of determines the presence of the modification mask 210 fabricated in the design tool 1. The receiving unit 12, shown in FIG. 16, receives initial inspection data on the initial wafer 120 from the inspection data memory 4, including the D/S data, sort data, and characteristic data. The receiving unit 12 may directly receive the initial inspection data from the D/S tester 70 and final tester 80.

The assignment unit 13 includes a distribution data generation unit 14 and a shot map generation unit 15. The distribution data generation unit 14 generates in-plane distribution data representing the in-plane distribution characteristic of the initial wafer 120 based on the initial inspection data received by the receiving unit 12. The distribution data generation unit 14 includes an inspection data judgment module 141 and a level point adding module 142. The inspection data judgment module 141 judges whether the initial inspection data received by the receiving unit 12 is within a threshold range of the threshold information from the threshold information memory 32. The level point adding module 142 adds up the level points corresponding to the values of the D/S data, sort data, and characteristic data with reference to the tone level definition from the tone level definition memory 33.

The inspection data judgment module 141 reads the threshold information, for example, shown in FIG. 18, and omits the initial wafer 120 with reference to the sort data, shown in FIG. 11, when the yield of the initial wafer 120 is 5% or less or when the percentage of DC faults of the initial wafer 120 is 90% or more. At the D/S coordinates (3, 2), for example, the D/S data, shown in FIG. 7, is classified as the second best acceptable chip region P2, the measured values of the characteristics A to C, shown in FIG. 10, are 40, 40, and 60 ns, respectively, and the sort data is classified as the second best acceptable chip region S2. The level point adding module 142, shown in FIG. 16, adds up the corresponding level points, shown in FIG. 19, of 140, 5, 10, 5, and 10 to obtain 170, as shown in FIG. 20. Also at the other D/S coordinates, the level points are added up, as shown in FIG. 20, in the same way. The in-plane distribution data, shown in FIG. 21, is thus generated.

The shot map generation unit 15 assigns the initial mask 110 and the modified mask 210 to the D/S coordinates (Xd, Yd) corresponding to a plurality of chip regions within the modified wafer, based on the in-plane distribution data generated by the distribution data generation unit 14. The shot map generation unit 15 includes an extraction module 151, a first assignment module 152, and a second assignment module 153.

The extraction module 151 extracts two D/S coordinates (Xd, Yd) of the chip regions having the lowest level points in the chip regions of the in-plane distribution data generated by the distribution data generation unit 14. For example, in the in-plane distribution data, shown in FIG. 21, the D/S coordinates (3, 3) with a level point of 108 and the D/S coordinates (2, 3) with a level point of 135 are extracted.

The first assignment module 152, shown in FIG. 16, assigns the initial mask 110 to one of the two D/S coordinates (Xd, Yd) extracted by the extraction module 151 and assigns the modified mask 210 to the other coordinates (Xd, Yd). For example, as shown in FIG. 22, the initial mask 110 and modified mask 210 are assigned to the D/S coordinates (3, 3) and (2, 3), respectively. In the drawing, the "initial" indicates that the initial mask 110 is assigned, and the "modified" indicates that the modified mask 210 is assigned.

The second assignment module 153, shown in FIG. 16, assigns the initial mask 110 and modified mask 210 to the remaining D/S coordinates (Xd, Yd) in a checker board pattern around the two D/S coordinates (Xd, Yd) to which the first assignment module 152 assigns the initial and modified masks 110 and 210. For example, around the two D/S coordinates (2, 3) and (3, 3), as shown in FIG. 21, the initial mask 110 is assigned to the D/S coordinates (3, 1), (2, 2), (2, 4), (3, 1), (3, 5), (4, 2), (4, 4), and (5, 3), and the modified mask 210 is assigned to the D/S coordinates (2, 3), (3, 2), (3, 4), and (4, 3). When the initial mask 110 and modified mask 210 run into the same D/S coordinates (Xd, Yd), the second assignment module 153 preferentially assigns, for example, the modified mask 210.

The recipe generation unit 16 reads mask information from the design data memory 7, the processing data from the processing data storage unit 361 and the common generation template recipe from the template recipe storage section 363, and the shot map generated by the shot map generation unit 15 and generates a recipe for exposure by the exposure tool 40. The sending unit 17 sends the recipe generated by the recipe generation unit 16 to the exposure tool 40.

Figure 24:
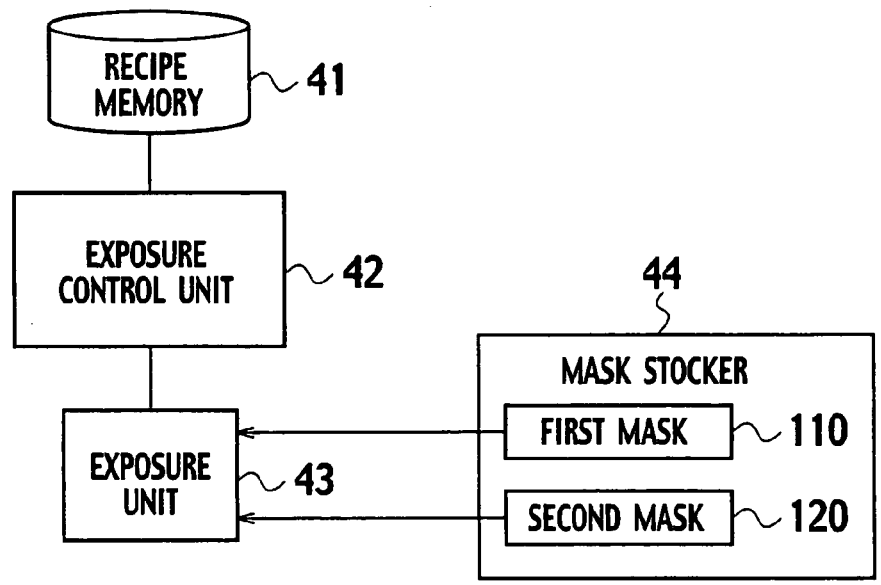
FIG. 24 is a block diagram showing an example of an exposure tool according to the embodiment of the present invention.

The exposure tool 40 can be a projection exposure tool, for example, such as a stepper. As shown in FIG. 24, the exposure tool 40 includes a mask stocker 44, a recipe memory 41, an exposure unit 43, and an exposure control unit 42. The mask stocker 44 accommodates the initial mask 110 and modified mask 210 fabricated by the design tool 1. The recipe memory 41 stores the recipe sent from the sending unit 17. The exposure unit 43 is capable of exposing the initial wafer 120 and modified wafer using the initial mask 110 and modified mask 210. The exposure control unit 42 controls the exposure unit 43 based on exposure conditions of the recipe from the recipe memory 41. The initial mask 110 and modified mask 210 can be conveyed to/loaded in the exposure unit 43 from the mask stocker 44 at any time.

Figure 25:
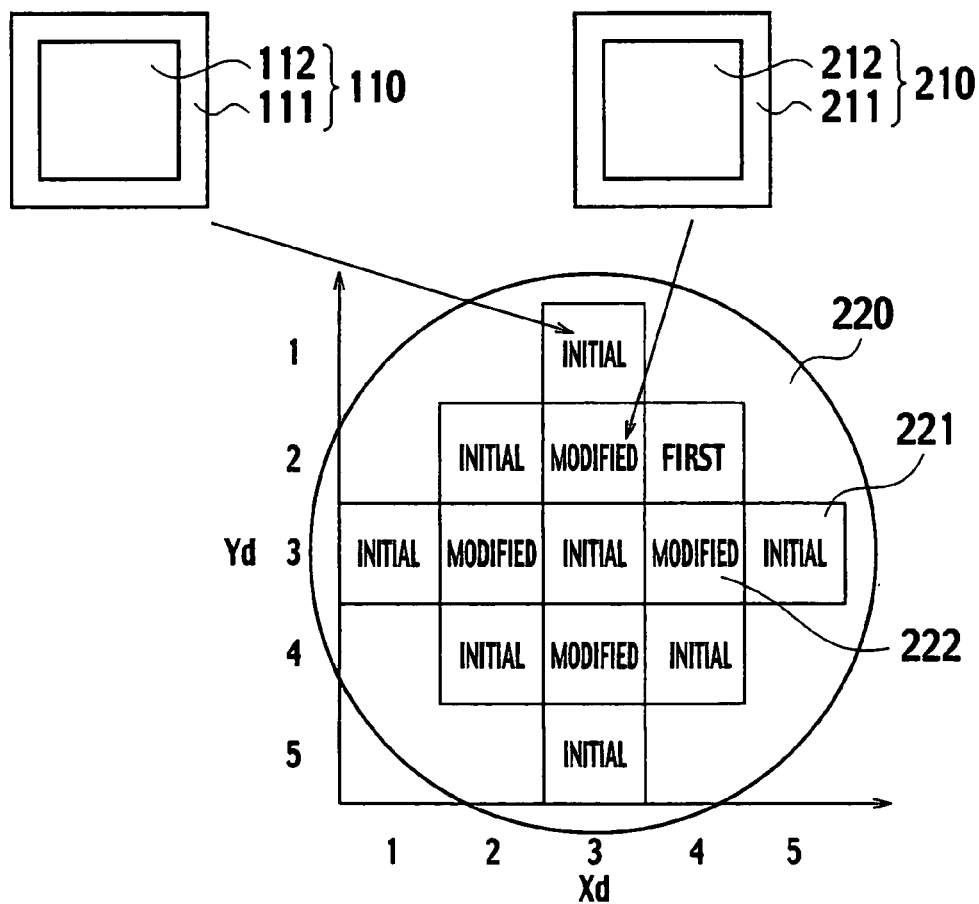
FIG. 25 is a schematic view showing an example of a method for exposing according to the embodiment of the present invention.

As shown in FIG. 25, the exposure unit 43 makes a transfer of chip regions 221 using the initial mask 110 (hereinafter, referred to as initial mask chip regions) and chip regions 222 (modified mask chip regions) using the modified mask 210 in the same semiconductor wafer (modified wafer) 220.

Figure 26:
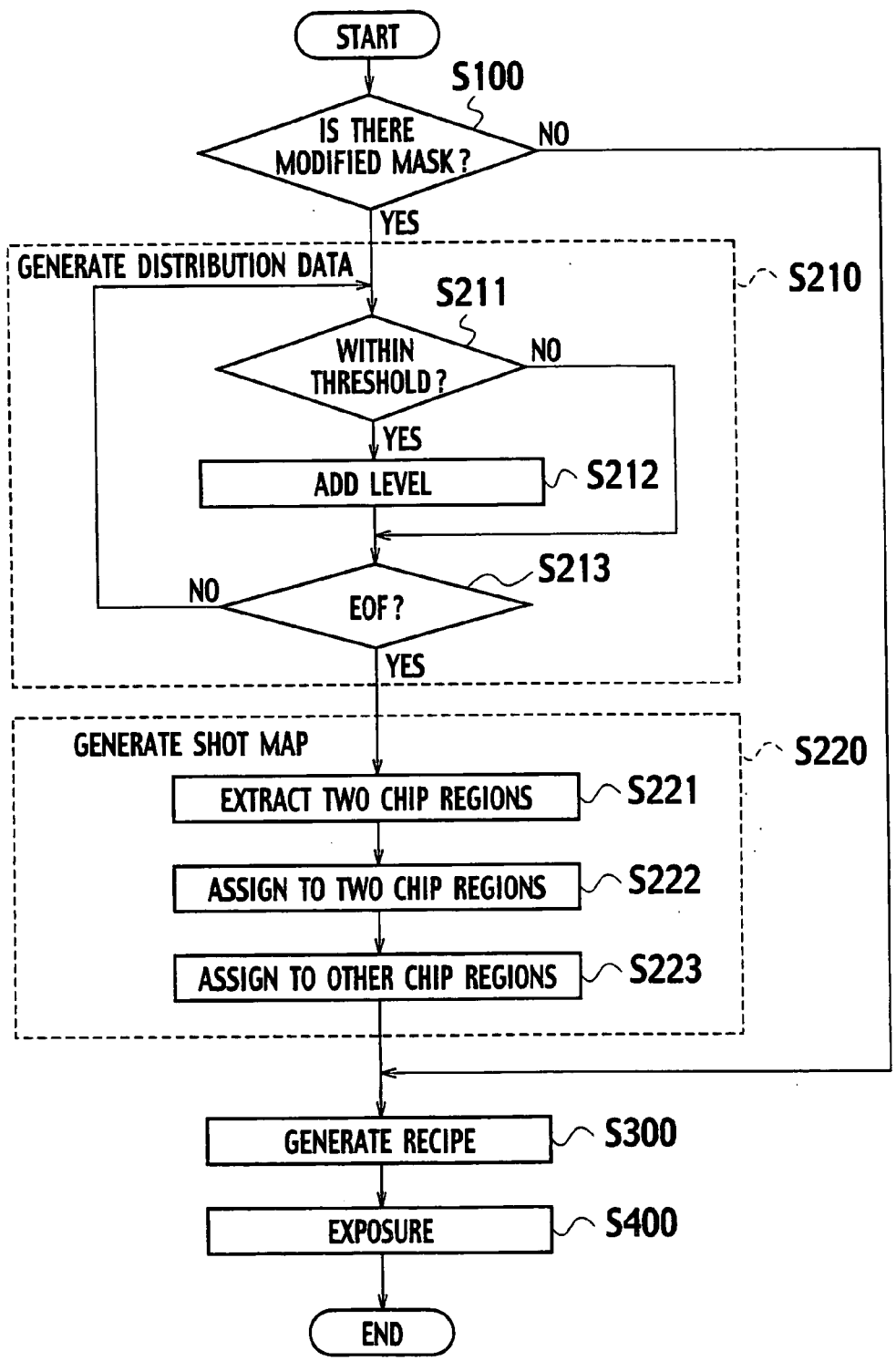
FIG. 26 is a flow chart showing an example of an exposing method according to the embodiment of the present invention.

Next, a exposure method according to the embodiment of the present invention will be described, referring to the flow chart shown in FIG. 26.

In step S100, the modification judgment unit 11 judges the presence of any modified mask produced by the design tool 1. When any modified mask is not present, the procedure advances to step S3. On the other hand, when the modified mask is present, the procedure advances to Step S211.

In step S211, the inspection data judgment module 141 judges whether the initial inspection data from the inspection data memory 4, such as the D/S data of the initial wafer 120, the characteristic data and the sort data, is within the range of threshold value from the threshold information memory 32. When the initial inspection data is out side the range of the threshold value, the initial inspection data is sorted, and the procedure advances to Step S213. On the other hand, in step S211, when the initial inspection data is within the range of the threshold value, the procedure advances to Step S212.

In step S212, the distribution data generation unit 14 adds the level points of the tone level definition from the tone level definition memory 33, corresponding to the initial inspection data including the D/S data, the characteristic data and the sort data.

In step S213, when there is still any unread chip region 121 within the initial wafer, the procedure returns to Step S211. That is, the procedures of steps S211 to S213 are repeated until processing of all the initial inspection data of the initial wafer 120 is completed. As a result, the in-plane distribution data is generated.

In step S221, the extraction module 151 extracts two D/S coordinates (Xd, Yd) having the lowest level points in the in-plane distribution data generated by the distribution data generation unit 14.

In step S222, the first assignment module assigns the initial mask 110 to one D/S coordinates (Xd, Yd) from among the two D/S coordinates (Xd, Yd) extracted by the extraction module 151, and assigns the modified mask 210 to the other D/S coordinates (Xd, Yd).

In step S223, the second assignment module 153 assigns initial mask 110 and the modified mask 210 to another unassigned D/S coordinates (Xd, Yd) in a checker board pattern, around the two D/S coordinates (Xd, Yd) to which the initial mask 110 and the modified mask 210 are assigned, respectively, by the first assignment module 152. As a result, a shot map is generated.

In step S300, the recipe generation unit 16 reads the recipe generation data from the recipe generation data memory 36 and the shot map generated by the shot map generation unit 15 to generate the recipe. The sending unit 17 sends the recipe generated by the recipe generation unit 16 to the exposure tool 40.

In step S400, the exposure tool 40 exposes the initial mask chip regions 211 and modified mask chip regions 212 within the modified wafer 220 adjacent to each other using the initial mask 110 and modified mask 210, respectively, based on the exposure conditions of the received recipe.

In the manufacturing line 3 of the manufacturing section 2, the modified inspection wafer 220 in which patterns are formed by a series of processes including the lithography process and the exposure system 300. The TEG measurement apparatus 60, die sort tester 70, and final tester 80 of the inspection tool 5, respectively, carry out a TEG measurement, a die sort test, and a final test for the modified wafer 220 in a similar way to the initial wafer 120. FIG. 27 shows an example of the characteristic data representing the characteristics of the circuit in each of initial and modified mask chip regions 221 and 222 of the modified wafer 220. While the specifications of the characteristics A to C are 20, 40, and 70, respectively, the measured values of the characteristics A to C of the circuit within the initial mask chip region 221 are 40, 40, 60 ns. The comparison shows that the characteristic A does not satisfy the characteristic A and the circuit is out of specification (faulty). On the other hand, the measured values of the characteristics A to C in the circuit of the modified mask chip region 222 are 10, 20, and 30 ns and satisfy the specifications 20, 40, and 70, which shows that the circuit is acceptable.

FIG. 28 shows an example of the sort data of the modified specification wafer 220 obtained by the final tester 80. In the initial mask chip regions 221 within the modified wafer 220, out of a total of 50 regions, there are 35 best acceptable chip regions S1, 5 second best acceptable chip regions S2, 5 third best acceptable chip regions S3, and 5 faulty chip regions F. The yield thereof is 90%. In the modified mask chip regions 222, out of a total of 50 regions, there are 35 acceptable chip regions S1, 15 seconds best acceptable chip regions S2, no third best acceptable chip regions S3, and 10 faulty chip regions F. The yield thereof is 90%.

At the D/S test, the evaluation tool 6 evaluates based on the D/S data of the initial and modified mask chip regions 221 and 222 within the modified wafer 220, whether there is a fatal fault or whether mask modification is required. At the final test, the evaluation tool 6 generates a table including the TEG measurement results, D/S data, characteristic data, and sort data of the modified wafer 220. Comparing the parameters of the initial and modified mask chip regions 221 and 222 of the modified wafer 220, which are shown in the table, the evaluation tool 6 then evaluates the improvement of the design of the modified mask 210 with respect to the initial mask 110. That is, whether the fault of the initial mask 110 is fixed by using the modified mask 210, whether the modified mask 210 has another fault, and the like.

The input unit 37, shown in FIG. 16, may be, for example, a keyboard, a mouse, a recognition device such as an optical character readers (OCR), a drawing input device such as an image scanner, or a special input unit such as a voice input device. The output unit 38 may be a display device such as a liquid crystal display (LCD), CRT display, or a printing device such as an ink jet printer or a laser printer.

The main memory 39 includes read-only memory (ROM) and random-access memory (RAM). The ROM stores a program executed by the CPU 10 (the details of the program are described later). The RAM serves as a temporary data memory for storing data used in executing a program by the CPU 10, and used as a working domain. As the main memory 39, a flexible disk, a CD-ROM, a MO disk, a cassette tape and an open reel tape, etc. can be used.

The system shown in FIG. 1 further includes memory manager (not shown) controls for reading and writing between the CPU 10, the inspection data memory 4, the threshold information memory 32, the tone level definition memory 33, the distribution data memory 34 and the shot map memory 35.

The system shown in FIG. 1 further includes an input/output manager (I/O interface) (not shown) for controlling the input unit 37, the output unit 38 and so on to the CPU 10.

Next, a method for evaluating a design of a mask, and a method for a mask and a semiconductor wafer, using the system shown in FIG. 1 will be described, referring to a flow chart showing FIG. 29. The inspection data memory 4, shown in FIG. 1, stores initial inspection data of an initial wafer, in advance.

Figure 29:
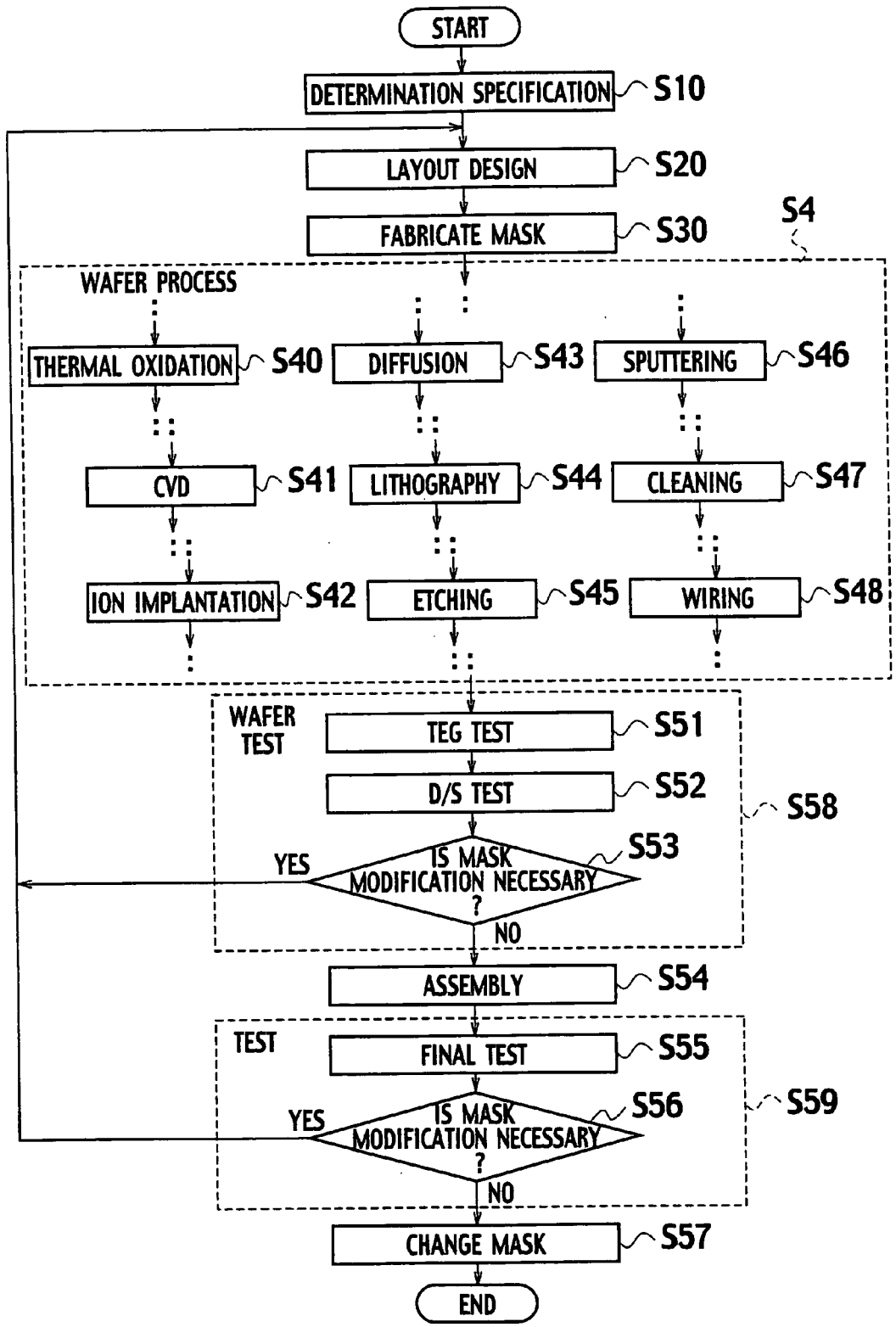
FIG. 29 is a flow chart showing an example of an evaluating method according to the embodiment of the present invention.

In step S10 of FIG. 29, in the design tool 1, functions and specifications of a semiconductor device are determined. In step S2, in the design tool 1, layout of the chip region is designed, based on the functions and specifications of the semiconductor determined in step S10. In step S3, an initial mask is provided based on the layout designed by the design tool 1 in step S2. Furthermore, a modified mask is also fabricated by modifying the initial mask provided in step S3.

In wafer processing of step S4, in the manufacturing section 2, a series of processes including a thermal oxidation process in step S40, a CVD process in step S41, an ion implantation process in step S42, a diffusion process in step S43, a lithography process in step S44, an etching process in step S45, a sputtering process in step S46, a cleaning process in step S47, and a wiring process in step S48 is repeatedly carried out. In the lithography process of step S40 using the initial and modified masks, the exposure system 300 exposes the initial and modified mask chip regions on a single wafer, adjacent to each other, similar to procedure of step S100 to S400 shown in FIG. 26. By the series of procedures, a modified wafer is provided.

In step S51, the TEG measurement apparatus 60 measures the TEG of the modified wafer, and obtains TEG measurement results. In step S52, the D/S tester 70 carries out a D/S test to the modified wafer, and obtains D/S data. In step S53, the evaluation tool 6 evaluates whether there is a need for mask modification, based on the D/S data. When mask modification is necessary, the procedures return to step S20, and the design tool 1 modifies design patterns etc., and a new modified mask is fabricated in step S30.

On the other hand, in step S53, when mask modification is not necessary, the procedure advances to Step S54. In step S54, a dicing apparatus with a diamond blade etc. dices the modified wafer into initial mask chip regions and modified mask chip regions. The chip is then mounted on a packaging material made of metal, ceramic or the like. After electrode pads on the chip and leads on a lead frame are connected to one another, a desired package assembly process, such as plastic molding, is performed. Consequently, semiconductor devices are provided.

In step S55, the final tester 80 carries out a final test on the semiconductor device (the initial and modified mask chip regions) in step S53, and obtains sort data and characteristic data.

In step S56, the evaluation tool 6 evaluates improvement of the design of the modified mask with respect to the initial mask, based on the TEG measurement results obtained in step S51, the D/S data obtained in step S52, the sort data and the characteristic data obtained in step S55. As a result of the evaluation, when mask modification is necessary, the procedure returns to step S20, and modified design patterns are further modified. Then in step S30, a new modified mask is fabricated. On the other hand, when further modification of the modified mask is not necessary in step S56, in lithography process in wafer processing, wafer production using the initial mask is changed to wafer production using the modified mask. That is, production wafers is exposed using the modified mask, and patterns are formed in the production wafers. Consequently, production semiconductor devices are provided.

According to the embodiment of the present invention, as shown in FIG. 25, the modified wafer 220 is provided by exposing the initial mask chip region 221 and the modified mask chip region 222 on a single semiconductor wafer, regions in adjacent to each other. Thereby it is possible to compare for each wafer, without considering the effect of manufacturing variations, which had been occurred in wafer processing. Therefore, it is possible to easily evaluate the modified wafer 220 by inspection and comparison of the initial mask chip region 221 and the modified mask chip region 222 in small volume.

Therefore, it is possible to change production from using the initial mask 110 to using the modified mask 210 quickly, and to provide semiconductor devices using the modified mask 210 with a high yield.

Furthermore, as shown in FIG. 23, for example, the initial mask 110 and the modified mask 210 are assigned within the modified wafer 220 so as to be equal in number and distribution, in a checker board pattern. Therefore, it is possible to reduce in-plane variations of the modified wafer 220.

The procedures shown in FIG. 29 can be executed by controlling the system with a computer program. The program includes: (a) an instruction for forming the modified mask chip region 222 with the modified mask 210 and the initial mask chip region 221 adjacent to the modified mask chip region 222 with the initial mask 110, respectively, in a single semiconductor wafer. The manufacturing is based on the initial inspection data of the initial wafer 120 provided using the initial mask 110 from the inspection data memory 4. The program also includes (b) an instruction for inspecting the initial mask chip region 221 and the modified mask chip region 222, by the inspection tool 5; and (c) an instruction for evaluating the improvement of the design of the modified mask 210 with respect to the initial mask 110 by comparing inspection data of the initial mask chip region 221 and the modified mask chip region 222, by the evaluation tool 6.

The program may be stored in the main memory 29 shown in FIG. 16 and the like of the system shown in FIG. 1. The program can be stored in a computer-readable storage medium. The procedures of the method of generating mask data can be performed by reading the program from the computer-readable storage medium to the main memory 39.

Here, the "computer-readable storage medium" means any media and the like that can store a program, including, e.g., external memory units, semiconductor memories, magnetic disks, optical disks, magneto-optical disks, magnetic tape, and the like, for a computer. To be more specific, the "computer-readable storage media" include flexible disks, CD-ROMs, MO disks, and the like. For example, the main body of the mask data generation system can be configured to incorporate a flexible disk drive and an optical disk drive, or to be externally connected thereto. A flexible disk is inserted into the flexible disk drive, a CD-ROM is inserted into the optical disk drive, and then a given readout operation is executed, whereby programs stored in these storage media can be installed in the main memory 39, D/S test program memory 73 and the final test program memory 83.

In addition, by connecting given drives to the mask data generation system, it is also possible to use, for example, a ROM as a memory unit employed for a game pack or the like, and cassette tape as magnetic tape. Furthermore, it is possible to store a program in another program storage device via a network, such as the Internet.

(First Modification)

Figure 30:
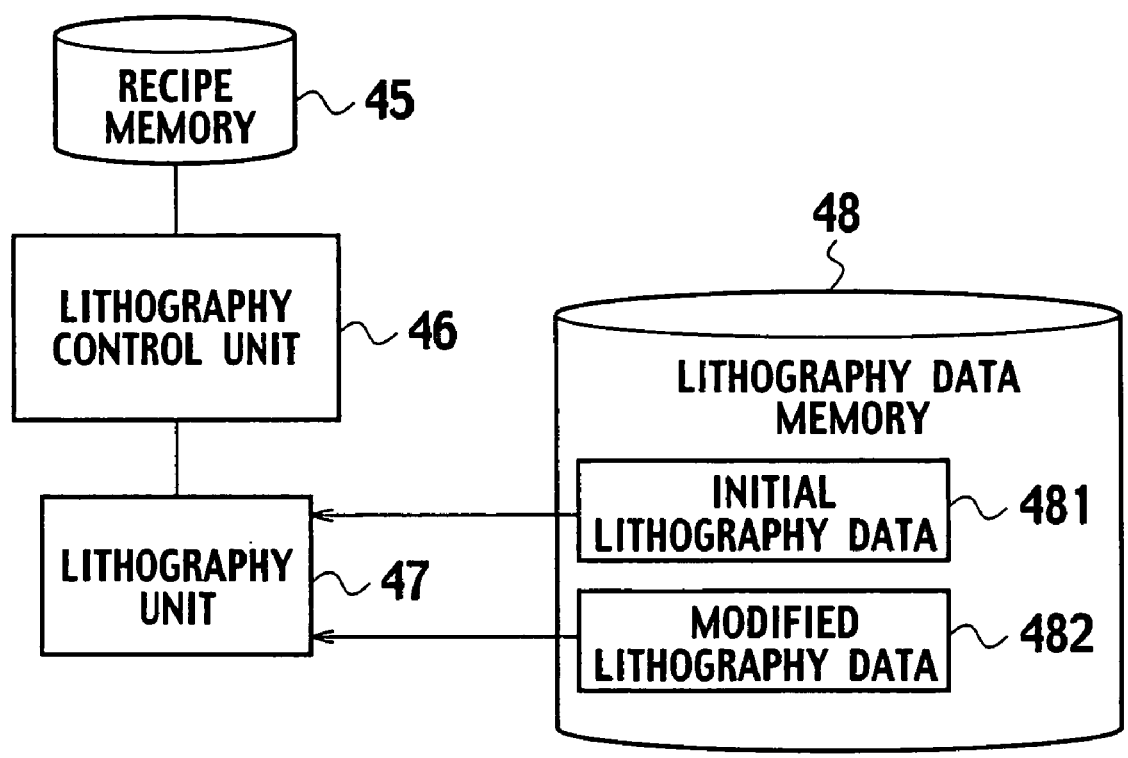
FIG. 30 is a schematic view of an EB lithography system according to a first modification of the embodiment of the present invention.

In a first modification of the embodiment of the present invention, as the exposure tool 40, shown in FIG. 16, an electron beam (EB) lithography apparatus, shown in FIG. 30, may be employed instead of the projection exposure tool shown in FIG. 24. In this case, "the initial lithography data" and "the modified lithography data" for directly writing by the EB lithography apparatus may be employed instead of "the initial mask" and "the modified mask" as explained in the embodiment.

The initial lithography data and the modified lithography data for directly writing using an EB lithography apparatus are generated by designing a layout in the design tool 1.

As shown in FIG. 23, the assignment unit 13 generates a shot map by assigning the initial lithography data and the modified lithography data to D/S coordinates (Xd, Yd). The recipe generation unit 16 shown in FIG. 16 generates a recipe for directly writing using the EB lithography apparatus, shown in FIG. 30, based on the shot map.

The EB lithography apparatus shown in FIG. 30 includes a lithography data memory 48, a recipe memory 45, a lithography control unit 46 and a lithography unit 47. The lithography data memory 48 stores initial lithography data 481 and modified lithography data 482 transmitted from the design tool 1. The recipe memory 45 stores the recipe for directly writing from the sending unit 17. The lithography control unit 46 controls the lithography unit 47, based on lithography condition in the recipe from the recipe memory 45. The lithography unit 47 directly writes lithography patterns of the initial lithography data 481 and the modified lithography data 482 from the lithography data memory 48 to the modified wafer 220, shown in FIG. 25. Other elements are substantially similar to the system shown in FIG. 1, and therefore will not be further described.

According to the first modification, in the case of using the EB lithography apparatus, shown in FIG. 30, as the exposure tool 40, lithography patterns of the initial lithography data 481 are written to the initial mask chip regions (initial writing chip regions) 221 of the modified wafer 220. On the other hand, lithography patterns of the modified lithography data 482 are written to the modified mask chip regions (modified writing chip regions) 222. Therefore it is possible to inspect and compare for each wafers, without effects due to manufacturing variations, in a wafer processing.

Therefore, it is possible to easily evaluate an improvement of the design, due to lithography data modification, by comparing the initial mask chip regions 221 and the modified mask chip regions 222.

(Second Modification)

Figure 31:
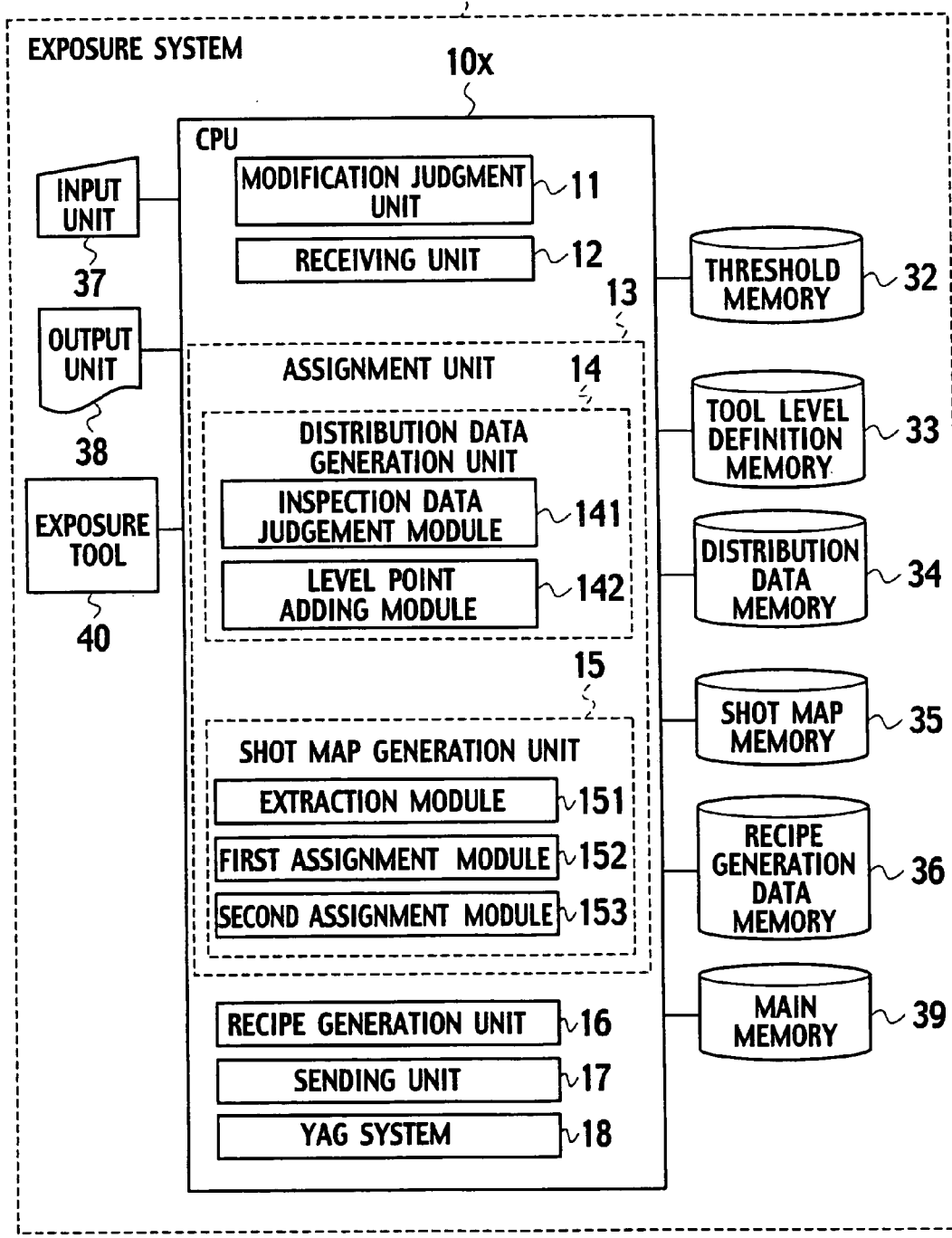
FIG. 31 is a block diagram of a system for an exposure system showing an example of according to a second modification of the embodiment of the present invention.

As shown in FIG. 31, a second modification of the embodiment of the present invention is different from the exposure system 300 shown in FIG. 16 in that the CPU 10x of an exposure system 300x further includes a yield management system (YMS) 18. In the second modification, input information, including a lot number of a wafer required to be inspected and data information required to be inspected, is entered through the input unit 37. The YMS 18 reads the QC data and fault data from the recipe generation data memory 36 and the TEG measurement result, D/S data, sort data, and characteristic data from the inspection data memory 4. The YMS 18 then associates the inspection data of the required data information of the required lot using the D/S coordinates as a key and outputs data of a degree-of-effect due to the mask modification.

Figure 32:
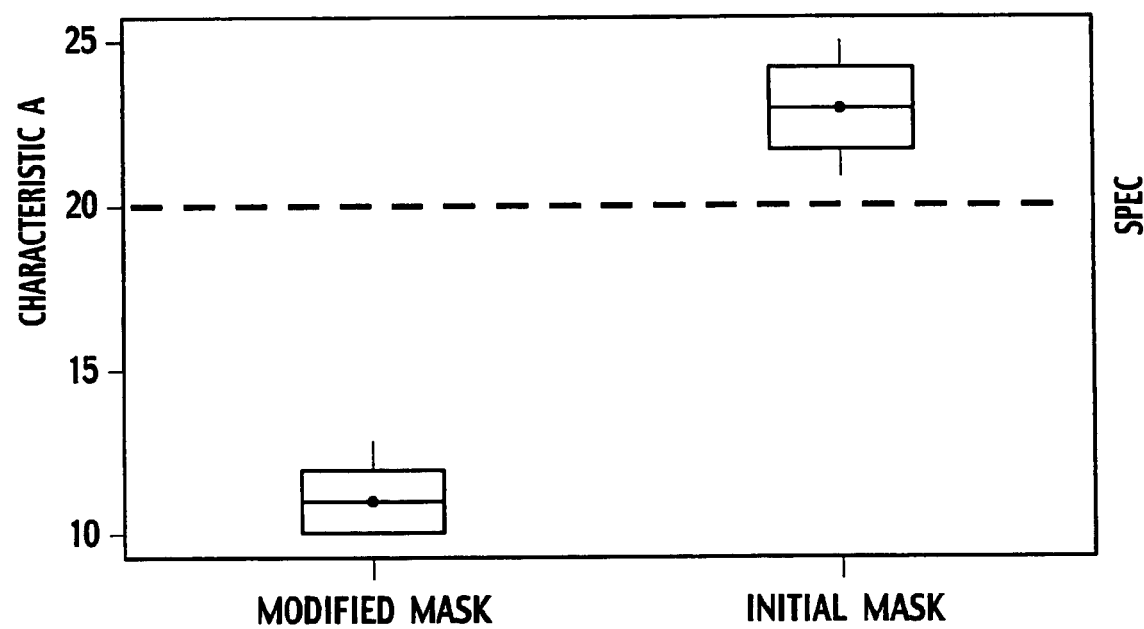
FIG. 32 is a graph showing an example of data of a degree-of-effect according to the second modification of the embodiment of the present invention.
Figure 41:
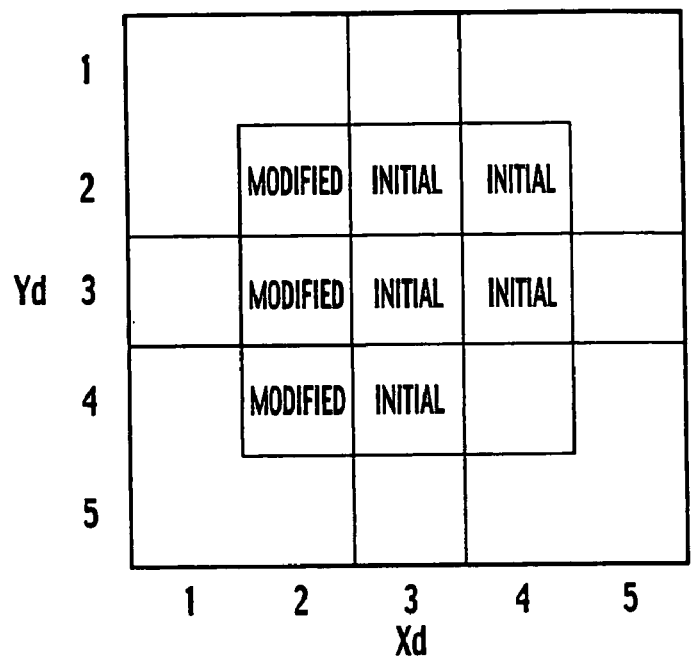

The YMS 18 exhibits, as the degree-of-effect data, for example, the values of the characteristic A of the initial and modified mask chip regions 221 and 222 within the modified wafer 220 as shown in FIG. 32. The region above the specification of 20 in the axis Y indicates that the characteristic is faulty. As for the initial mask chip regions 221, the characteristic values are distributed in a range of 20 to 25. As for the modified mask chip regions 222, the characteristic values are distributed around 10. Accordingly, it can be estimated that the mask modification considerably improves the characteristic A. The other elements of the configuration are substantially the same as those of the evaluation system shown in FIG. 1, and a redundant description is omitted.

According to the second modification, even when lot numbers in the wafer processing, D/S test, and final test are different from each other, the degree-of-effect data can be easily and instantly displayed using the YMS 18. It is therefore possible to evaluate the need for mask modification and eliminate the need for the user to process and compile the inspection data.

(Third Modification)

In a third modification of the embodiment of the present invention, the shot map generation unit 15 may assign the initial mask 110 and the modified mask 210 in a stripe form. That is, as shown in FIG. 33, the initial mask 110 is assigned to D/S coordinates (1, 3), (3, 1) (3, 2), (3, 3), (3, 4), (3, 5), (5, 3), respectively, and the modified mask 210 is assigned to D/S coordinates (2, 2), (2, 3), (2, 4), (4, 2), (4, 3), (4, 4), in a stripe along the Yd axis direction.

As another example, as shown in FIG. 34, in a stripe along the xd axis direction, the initial mask 110 is assigned to D/S coordinates (3, 1), (1, 3), (2, 3), (3, 3), (4, 3), (5, 3), (3, 5), and the modified mask 210 is assigned to D/S coordinates (2, 2), (3, 2), (4, 2), (2, 4), (3, 4), (4, 4).

As an additional example, as shown in FIG. 35, the D/S coordinates (3, 3) having the lowest level point in the in-plane distribution data is centrally located, and the initial mask 110 may be assigned to the D/S coordinates (3.1), (3, 2), (3, 4), (3, 5), (1, 3), (2, 3), (4, 3), (5, 3) in a cross-shape. The modified mask 210 may be assigned to the other D/S coordinates (2, 2), (4, 2), (2, 4), (4, 4).

As a further additional example, as shown in FIG. 36, the initial mask 110 may be assigned to the D/S coordinates (3, 1), (3, 2), (3, 3), (3, 4), (3, 5), (4, 2), (4, 3), (4, 4), (5, 3) distributed in Xd coordinates 3 or more than 3 of D/S coordinates (3, 3) having the lowest level points in the in-plane distribution data. Then, the modified mask 210 may be assigned to the D/S coordinates (1, 3), (2, 2), (2, 3), (2, 4) distributed in less than Xd coordinates 3.

According to the third modification, in the case the initial mask 110 and the modified mask 210 are assigned as shown in FIGS. 33 to 36, it is possible to inspect each wafers, without effects of manufacturing variations in wafer processing. Therefore, it is possible to easily determine the change of production from the initial mask 110 to the modified mask 210.

(Fourth Modification)

In a fourth modification of the embodiment of the present invention, because of the emphasis on productivity, it is not necessary for the shot map generation unit 15 to assign the initial and modified masks to the D/S coordinates (Xd, Yd) of chip regions with high level points among the D/S coordinates (Xd, Yd) in the in-plane distribution data. In other words, the shot map generation unit 15 may assign the initial and modified masks to only the D/S coordinates (Xd, Yd) of chip regions with low level points in the in-plane distribution data. The threshold value of the level point for the assignment can be arbitrarily determined.

For example, as shown in FIG. 37, the shot map generation unit 15 generates a shot map by assigning the initial mask 110 and the modified mask 210 to D/S coordinates (Xd, Yd) so as to avoid D/S coordinates (3, 1), (1, 3), (5, 3), (4, 4), (3, 5) which have the level points "1000" or more than "1000" in the in-plane distribution data, using an algorithm which is similar to the algorithm shown in FIG. 23.

The recipe generation unit 16 generates a recipe based on the shot map shown in FIG. 37. Then the exposure tool 40 exposes chip regions within a semiconductor wafer so as to avoid the chip regions corresponding to D/S coordinates (3, 1), (1, 3), (5, 3), (4, 4), (3, 5).

By comparing the initial mask chip region 221 and the modified mask chip region 222 corresponding D/S coordinates (Xd, Yd) of the low level points, it is possible to inspect wafers with high efficiency. Therefore, it is not necessary to expose the chip regions corresponding to D/S coordinates (Xd, Yd) of high level points. Consequently, it is possible to reduce the shot number by the exposure tool 40, and improve through put.

As another example, as shown in FIGS. 38 to 41, using algorithms similar to the algorithms shown in FIGS. 33 to 36, the initial mask 110 and the modified mask 210 may be assigned to D/S coordinates (Xd, Yd) so as to avoid D/S coordinates (1, 3), (3, 1), (3, 5), (4, 4), (5, 3) that are more than the level points "1000" in the in-plane distribution data.

Figure 42:
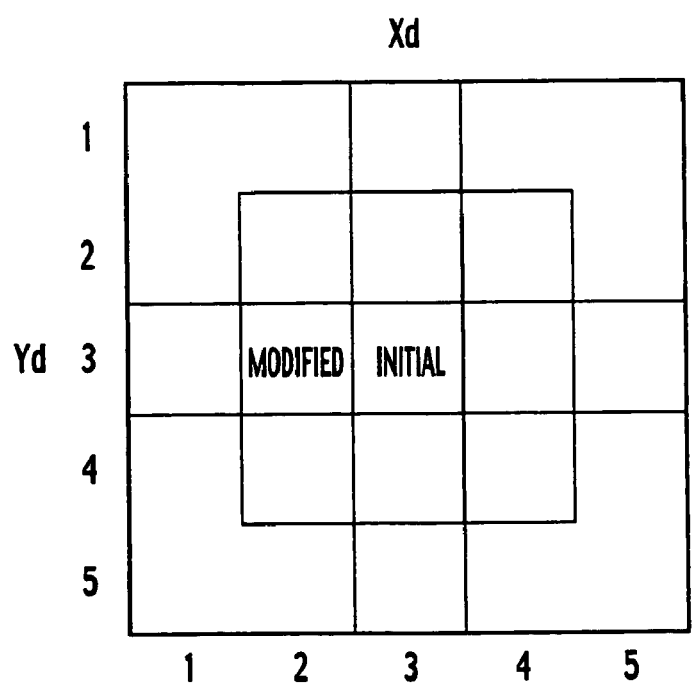

As an additional example, as shown in FIG. 42, using an algorithm that is the same as the algorithm shown in FIG. 23, the initial mask 110 and the modified mask 210 may be assigned to only two D/S coordinates (3, 3), (2, 3) of the lowest the level points in the in-plane distribution data.

According to the fourth modification, by assigning the initial mask 110 and the modified mask 210 to only D/S coordinates (Xd, Yd) of the lowest level points, which are effective for wafer inspection, it is possible to improve productivity.

(Fifth Modification)

In a fifth modification of the embodiment of the present invention, the shot map generation unit 15 may assign an initial mask A and two different types of modified masks B and C, or more than two types of modified masks, to the modified wafer. The initial mask A has the same structure as that of the initial mask 110. The modified masks B and C are obtained by making different modifications to the initial mask A by means of the design tool 1. The shot map generation unit 15 repeats a sequential assignment of the initial mask A, modified mask B, and modified mask C starting from the D/S coordinates (Xd, Yd) of the chip region with a low level point of the in-plane distribution data in ascending order. When the level points of several chip regions are the same, any one of the coordinates (Xd, Yd) may be selected.

For example, the shot map generation unit 15 assigns the initial mask A, the modified mask B, and the modified mask C, to the D/S coordinates (3, 3) of the level points "108" shown in FIG. 21, the D/S coordinates (2, 3) of the level points "135", and D/S coordinates (3, 2) of the level points "170".

Furthermore, the initial mask A, the modified mask B, and the modified mask C are assigned to the D/S coordinates (2, 4) of the level points "175", the D/S coordinates (4, 3) of the level points "186", and the D/S coordinates (3, 4) of the level points "300".

Furthermore, the initial mask A and the modified mask B are assigned to the D/S coordinates (2, 2) of the level points "320", and the D/S coordinates (4, 2) of the level points "360".

As shown in FIG. 43, the modified mask C, the initial mask A, the modified mask B, the modified mask C, and the initial mask A are assigned to the D/S coordinates (1, 3) (3, 1), (3, 5), (4, 4), (5, 3) of the level points "1000".

According to the fifth modification, it is possible to reduce manufacturing variations for each semiconductor wafers in wafer processing. Therefore it is possible to easily determine a change in production from the initial mask A to the modified masks B, C in inspection process.

Furthermore, it is possible to assign the initial mask A, and the modified masks B, C or more than two different types of modified masks within a single modified wafer. Therefore it is possible to efficiently evaluate a plurality of modified masks B, C.

Note that, in actuality, numerous chip regions are formed within a semiconductor wafer. Thus, four or more types of initial masks and/or modified masks may be assigned.

(Other Embodiments)

Various modifications will become possible for those skilled in the art after receiving the teachings of the present disclosure without departing from the scope thereof.

For example, the initial mask and modified mask are not necessarily a mask fabricated first and a subsequently fabricated mask in the design tool 1, respectively, and may be masks before and after modification.

The extraction module 151, shown in FIG. 16, extracts two coordinates (Xd, Yd) of the chip regions having the lowest level points of the in-plane distribution data; However, the extraction module may extract one coordinate (Xd, Yd) of the chip region with the lowest level point. The first assignment module 152 assigns the initial mask 110 to the D/S coordinates (Xd, Yd), extracted by the extraction module 151. The second assignment module 153 assigns the modified mask 210 to the D/S coordinates (Xd, Yd) of the chip regions on the left, right, upper, and lower sides of the D/S coordinates (Xd, Yd), to which the first assignment module 152 assigns the initial mask 110. The second assignment module 153 further assigns the initial mask 110 to the D/S coordinate (Xd, Yd) on the left, right, upper, and lower sides of the D/S coordinates (Xd, Yd), to which the modified mask 210 is assigned. A shot map as shown in FIG. 22 is thus generated.

Alternatively, the first assignment module 152 may assign the modified mask 210 to the D/S coordinates (Xd, Yd) of the chip region extracted by the extraction module 151, and it is therefore possible to generate a shot map with the initial and modified masks 110 and 210 replaced with each other in the shot map of FIG. 21. Moreover, the shot map generation unit 15 may alternately assign the initial and modified masks 110 and 210 starting from the chip region with the lowest level point of the in-plane distribution data in ascending order.

Figure 45:
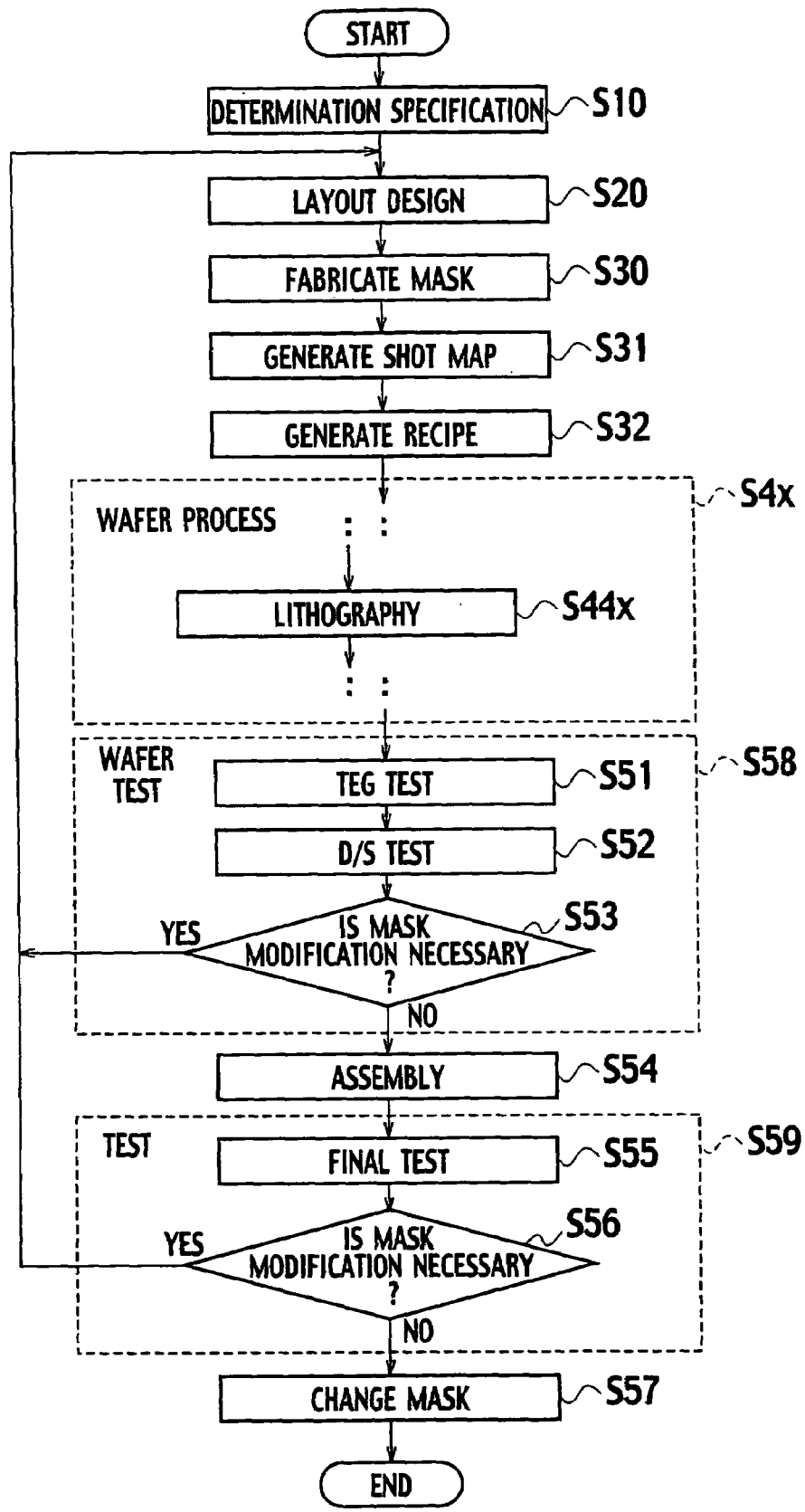
FIG. 45 is a flow chart showing an example of an evaluating method according to another embodiment of the present invention.

Instead of the procedure of the evaluation method shown in FIG. 29, a procedure shown in FIG. 45 may be employed. After a mask is fabricated in step S3, in step S31, the presence of the modified mask 210 is determined in the same way as the processes of the steps S100 to S220 shown in FIG. 26, and the shot map is generated. The recipe is then generated in step S32. In the lithography process of step S44x in the wafer processing of step S4x, the transfer is carried out using the exposure tool 40, shown in FIG. 16, based on the exposure conditions of the recipe already generated in the step S32. The other parts of the procedure are substantially the same as those shown in FIG. 29, and a redundant description thereof is omitted.

The initial mask 110 and the modified mask 210 can be manufactured by external tools, instead of the design tool 1, based on the designs generated by the design tool 1. The initial wafer 120 and the modified wafer 220 can be manufactured by external tools instead of the manufacturing tools 300 to 30n.

What is claimed is:

1. A system for evaluating a design of a mask comprising:
    an inspection data memory configured to store initial inspection data of an initial wafer in which a pattern is formed by an initial mask;
    a design tool configured to design a modified mask by modifying the initial mask based on the initial inspection data;
    a group of manufacturing tools configured to forming in a modified wafer an initial mask chip region with the initial mask and a modified mask chip region adjacent to the initial mask region with the modified mask;
    an inspection tool configured to inspect faults in the initial and modified mask chip regions after a series of processes executed by the manufacturing tools; and
    an evaluation tool configured to evaluate an improvement of the design of the modified mask with respect to the initial mask, by comparing inspected faults in the initial and modified mask chip regions.

2. The system of claim 1, wherein the group of manufacturing tools comprises:
    an assignment unit configured to assign the initial and modified masks to the initial and modified mask chip regions, respectively, based on the initial inspection data; and
    an exposure tool configured to expose the patterns of the initial and modified masks so as to form the initial and modified mask chip regions, respectively.

3. The system of claim 2, wherein the assignment unit provides an equal number of the initial and modified mask chip regions.

4. The system of claim 2, wherein the assignment unit assigns the initial and modified mask chip regions to locations each having a higher relative performance than other locations measured in the initial wafer.

5. The system of claim 1, wherein the inspection tool inspects fault in the initial and modified mask chip regions by different tests; and
    the evaluation tool evaluates an improvement of the design for each of the tests.

6. The system of claim 1, wherein the design tool further modifies the design of the modified mask based on results of the evaluation.

7. The system of claim 1, wherein the design tool designs different modified masks.

8. The system of claim 7, wherein the group of manufacturing tools forms the plurality of modified mask chip regions with each of the modified masks, respectively.

9. A system for evaluating a design of a mask comprising:
    an inspection data memory configured to store initial inspection data of an initial wafer in which a pattern is formed by initial lithography data;
    a design tool configured to design modified lithography data by modifying the initial lithography data based on the initial inspection data;
    a group of manufacturing tools configured to form in a modified wafer an initial lithography chip region with the initial lithography data and a modified lithography chip region adjacent to the initial lithography chip region with the modified lithography data;
    an inspection tool configured to inspect faults in the initial and modified lithography chip regions after a series of procedures executed by the manufacturing tools; and
    an evaluation tool configured to evaluate an improvement of the design of the modified lithography data with respect to the initial lithography data by comparing inspected faults in the initial and modified lithography chip regions.

10. A method for evaluating a design of a mask comprising:
    designing a modified mask by modifying the initial mask based on initial inspection data of an initial wafer in which a pattern is formed by an initial mask;
    forming in a modified wafer an initial mask chip region with the initial mask and a modified mask chip region adjacent to the initial mask chip region with the modified mask;
    inspecting faults in the initial and modified mask chip regions after a series of the procedures; and
    evaluating an improvement of the design of the modified mask with respect to the initial mask by comparing inspected faults in the initial and modified mask chip regions.

11. The method of claim 10, wherein the forming the initial and modified mask chip regions comprises:
    assigning the initial and modified mask chip regions respectively, in the modified wafer, based on the initial inspection data; and
    exposing patterns of the initial and modified masks so as to form the initial and modified mask chip regions, respectively.

12. The method of claim 11, wherein the assigning of the initial and modified masks comprises providing an equal number of the initial and modified mask chip regions.

13. The method of claim 11, wherein the assigning of the initial and modified mask chip regions comprises assigning the initial and modified mask chip regions to locations each having a higher relative performance than other locations measured in the initial wafer.

14. The method of claim 10, wherein inspecting the faults comprises inspecting the initial and modified mask chip regions by different tests; and
    evaluating the improvement of the design comprises evaluating the improvement of the design of the modified mask with respect to the initial mask for each of the tests.

15. The method of claim 10, further comprising further modifying the design of the modified mask based on result of the evaluation.

16. The method of claim 10, wherein designing the modified mask comprises designing different modified masks; and
    forming the modified mask chip regions comprises forming different modified mask chip regions with each of the modified masks.

17. A method for manufacturing a semiconductor device comprising:
    designing a modified mask by modifying the initial mask based on initial inspection data of an initial wafer in which a pattern is formed by an initial mask;
    forming in a modified wafer an initial mask chip region with the initial mask and a modified mask chip region adjacent to the initial mask chip region with the modified mask;

inspecting faults in the initial and modified mask chip regions after a series of the procedures;

evaluating an improvement of the design of the modified mask with respect to the initial mask by comparing inspected faults in the initial and modified mask chip regions;

further modifying the design of the modified mask when the design is improved; and forming a pattern in a production wafer with the modified mask when the design is improved.

18. A mask produced by:

designing a modified mask by modifying the initial mask based on initial inspection data of an initial wafer in which a pattern is formed by an initial mask;

forming in a modified wafer an initial mask chip region with the initial mask and a modified mask chip region adjacent to the initial mask chip region with the modified mask;

inspecting faults in the initial and modified mask chip regions after a series of the procedures;

evaluating an improvement of the design of the modified mask with respect to the initial mask by comparing inspected faults in the initial and modified mask chip regions;

further modifying the design of the modified mask based on results of the evaluation.

* * * * *